US012057168B2

(12) United States Patent
Masuduzzaman et al.

(10) Patent No.: US 12,057,168 B2
(45) Date of Patent: Aug. 6, 2024

(54) NEIGHBOR AWARE MULTI-BIAS PROGRAMMING IN SCALED BICS

(71) Applicant: SanDisk Technologies LLC, Addison, TX (US)

(72) Inventors: Muhammad Masuduzzaman, Milpitas, CA (US); Deepanshu Dutta, Fremont, CA (US)

(73) Assignee: SanDisk Techn ologies LLC

( * ) Notice: Subject to any disclaimer, the term of this patent is extended or adjusted under 35 U.S.C. 154(b) by 677 days.

(21) Appl. No.: 16/899,860

(22) Filed: Jun. 12, 2020

(65) Prior Publication Data

US 2021/0391012 A1   Dec. 16, 2021

(51) Int. Cl.

| | |
|---|---|
| *G11C 16/10* | (2006.01) |
| *G11C 16/04* | (2006.01) |
| *G11C 16/14* | (2006.01) |
| *G11C 16/24* | (2006.01) |
| *G11C 16/26* | (2006.01) |
| *G11C 16/34* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC .......... *G11C 16/10* (2013.01); *G11C 16/0483* (2013.01); *G11C 16/14* (2013.01); *G11C 16/24* (2013.01); *G11C 16/26* (2013.01); *G11C 16/3459* (2013.01); *H10B 41/10* (2023.02); *H10B 41/27* (2023.02); *H10B 43/10* (2023.02); *H10B 43/27* (2023.02)

(58) Field of Classification Search
CPC ..... G11C 16/10; G11C 16/0483; G11C 16/24; G11C 16/14; G11C 16/3459; G11C 16/26; H01L 27/11556; H01L 27/11519; H01L 27/11565; H01L 27/11582
See application file for complete search history.

(56) References Cited

U.S. PATENT DOCUMENTS

| | | | |
|---|---|---|---|
| 10,014,063 B2* | 7/2018 | Tseng | ..................... G11C 16/10 |
| 2020/0294600 A1* | 9/2020 | Shibuya | ............. G11C 16/3427 |

* cited by examiner

*Primary Examiner* — Alfredo Bermudez Lozada

(74) *Attorney, Agent, or Firm* — Dickinson Wright PLLC; Steven C. Hurles

(57) ABSTRACT

A storage device may be configured to determine data states for a first set of memory cells, of an array of memory cells, that are part of a logical N−1 neighboring word line that is adjacent to a selected word line. The storage device may be further configured to determine a program voltage configuration based on the data states. The storage device may be further configured to determine, using the program voltage configuration, a program operation on the selected word line to iteratively program respective memory cells, of a second set of memory cells that are part of the selected word line. Determining the data states, determining the program voltage configuration, and performing the program operation may be repeated until a program stop condition is satisfied.

6 Claims, 20 Drawing Sheets

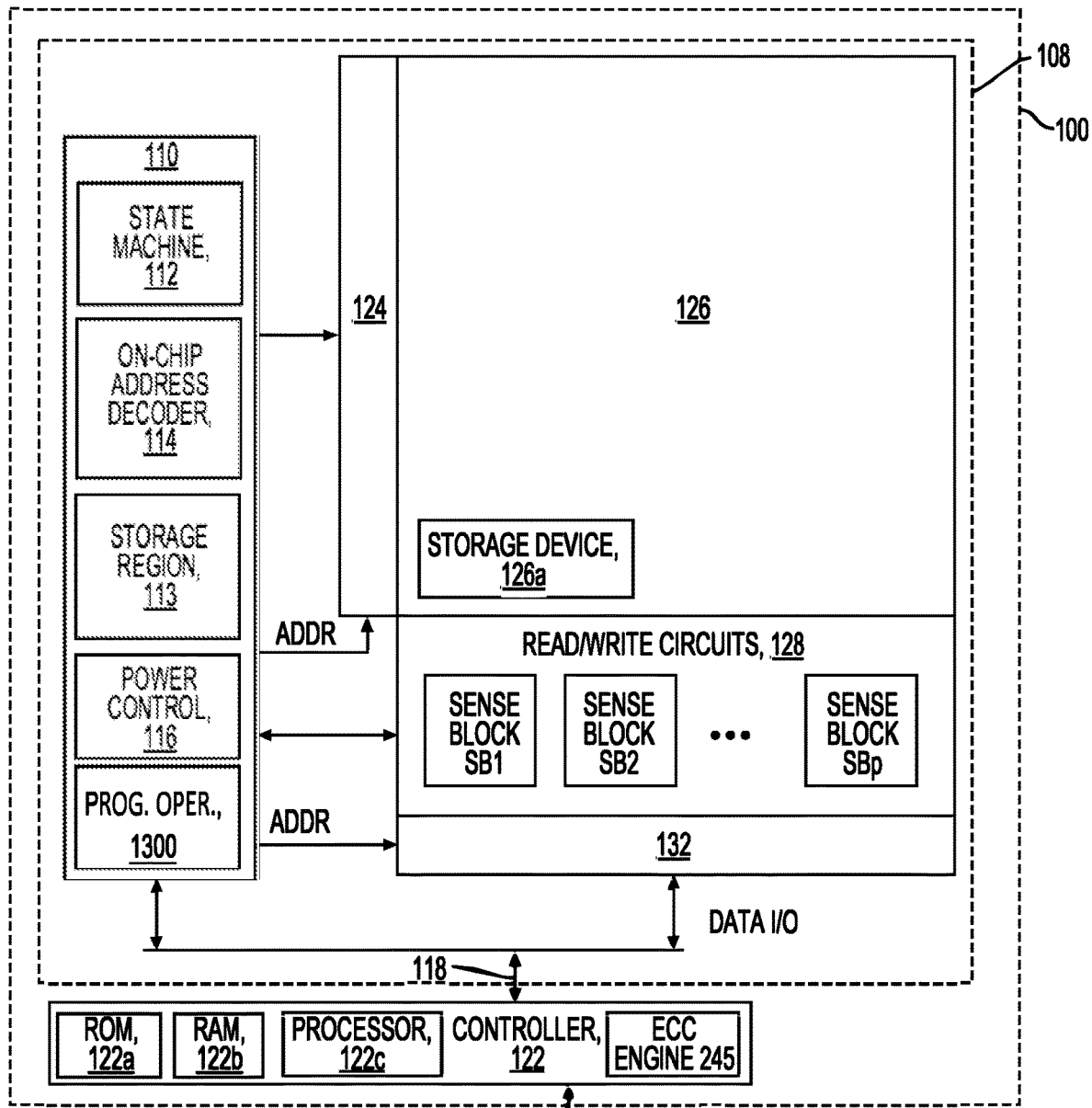
*FIG. 1A - Prior Art*
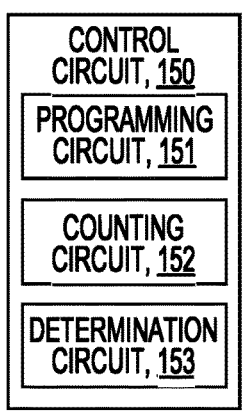
*FIG. 1B - Prior Art*

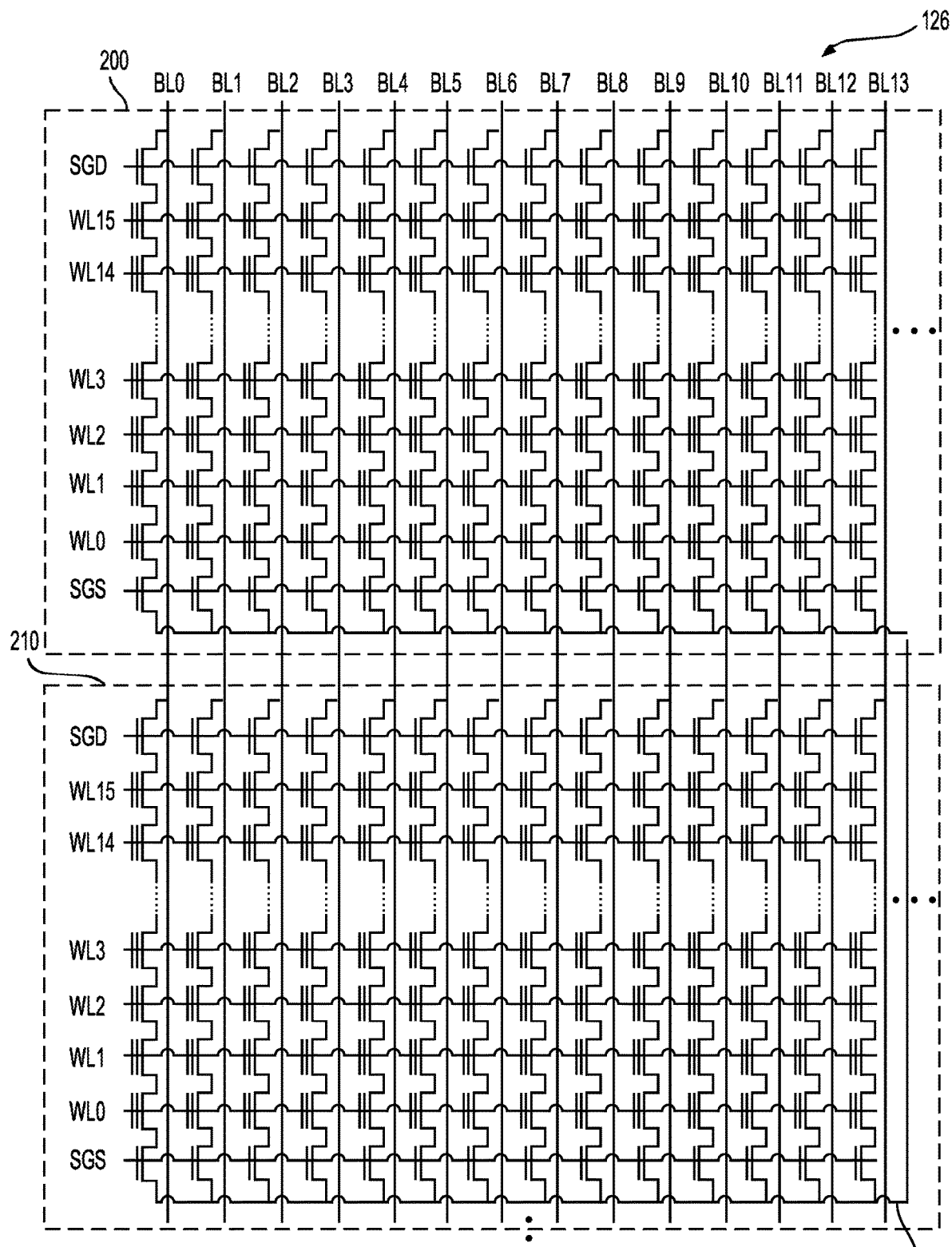
FIG. 2 - Prior Art

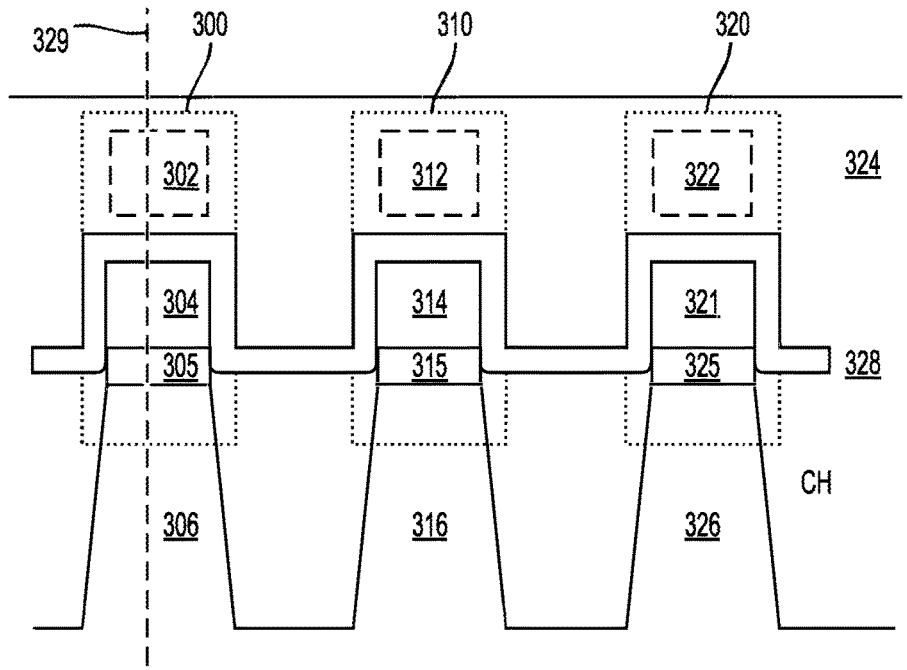
FIG. 3A - Prior Art
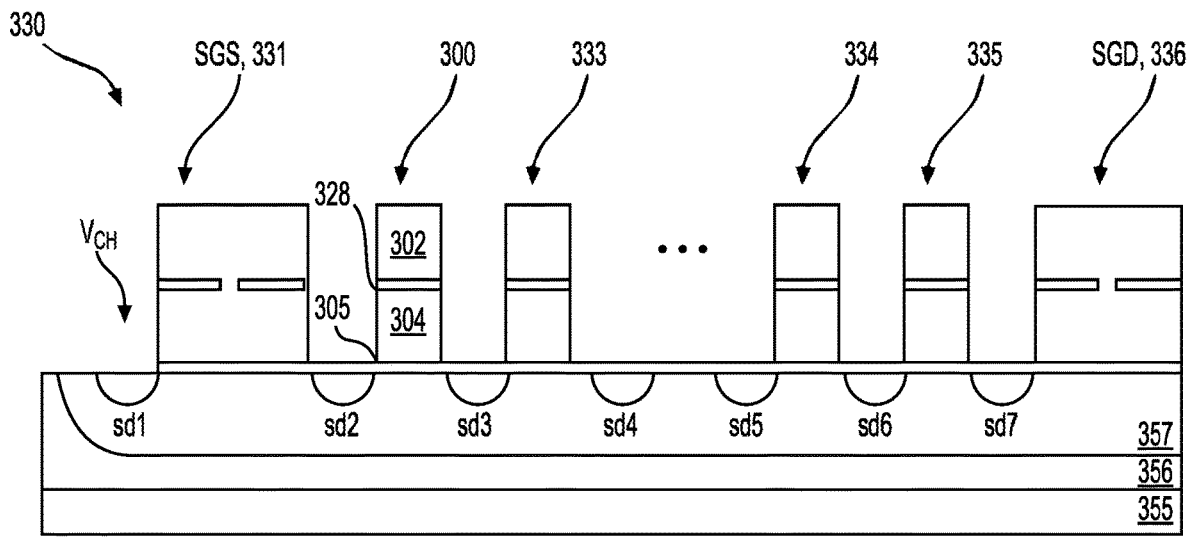
FIG. 3B - Prior Art

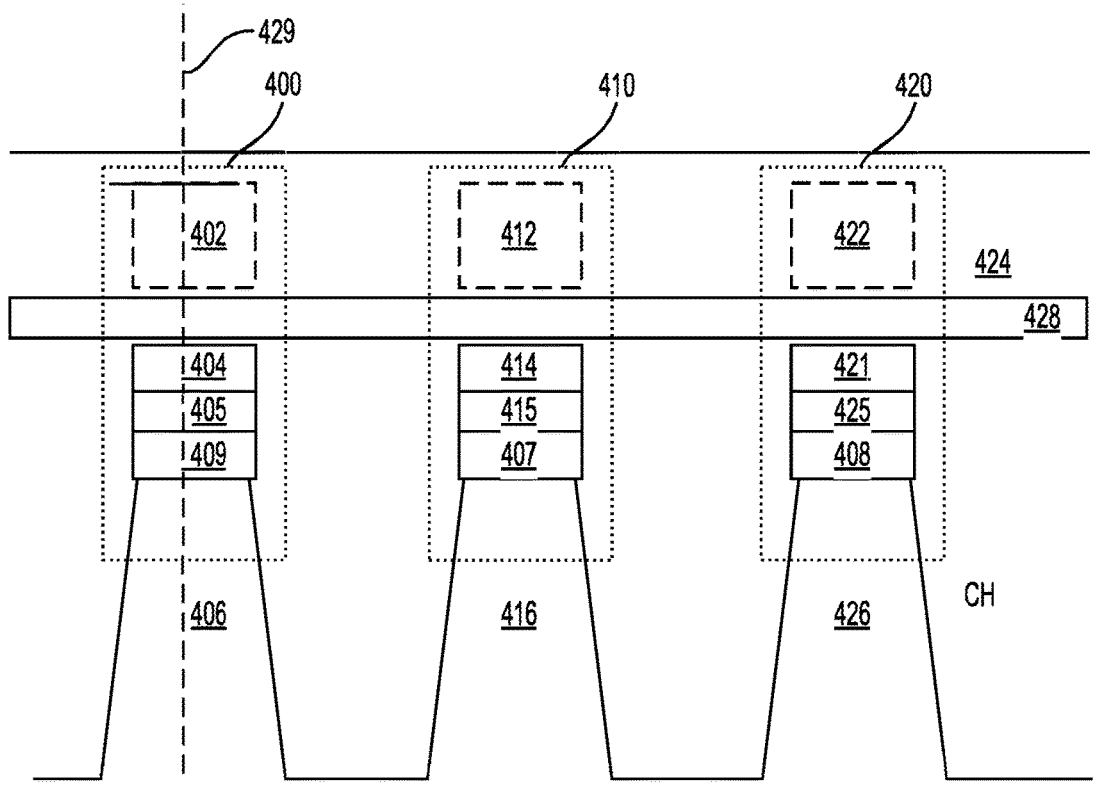
FIG. 4A - Prior Art
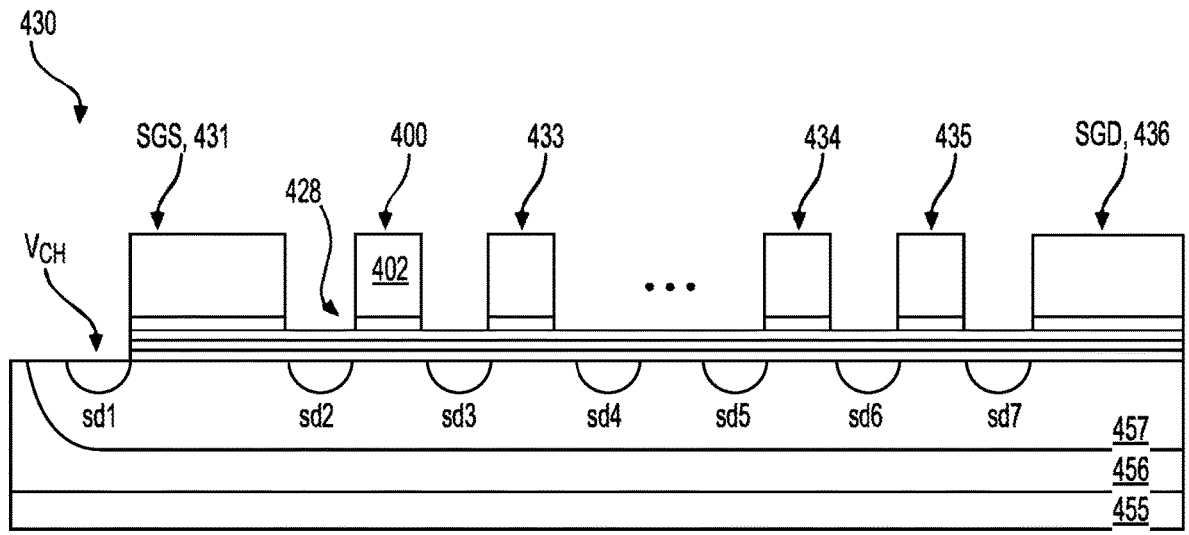
FIG. 4B - Prior Art

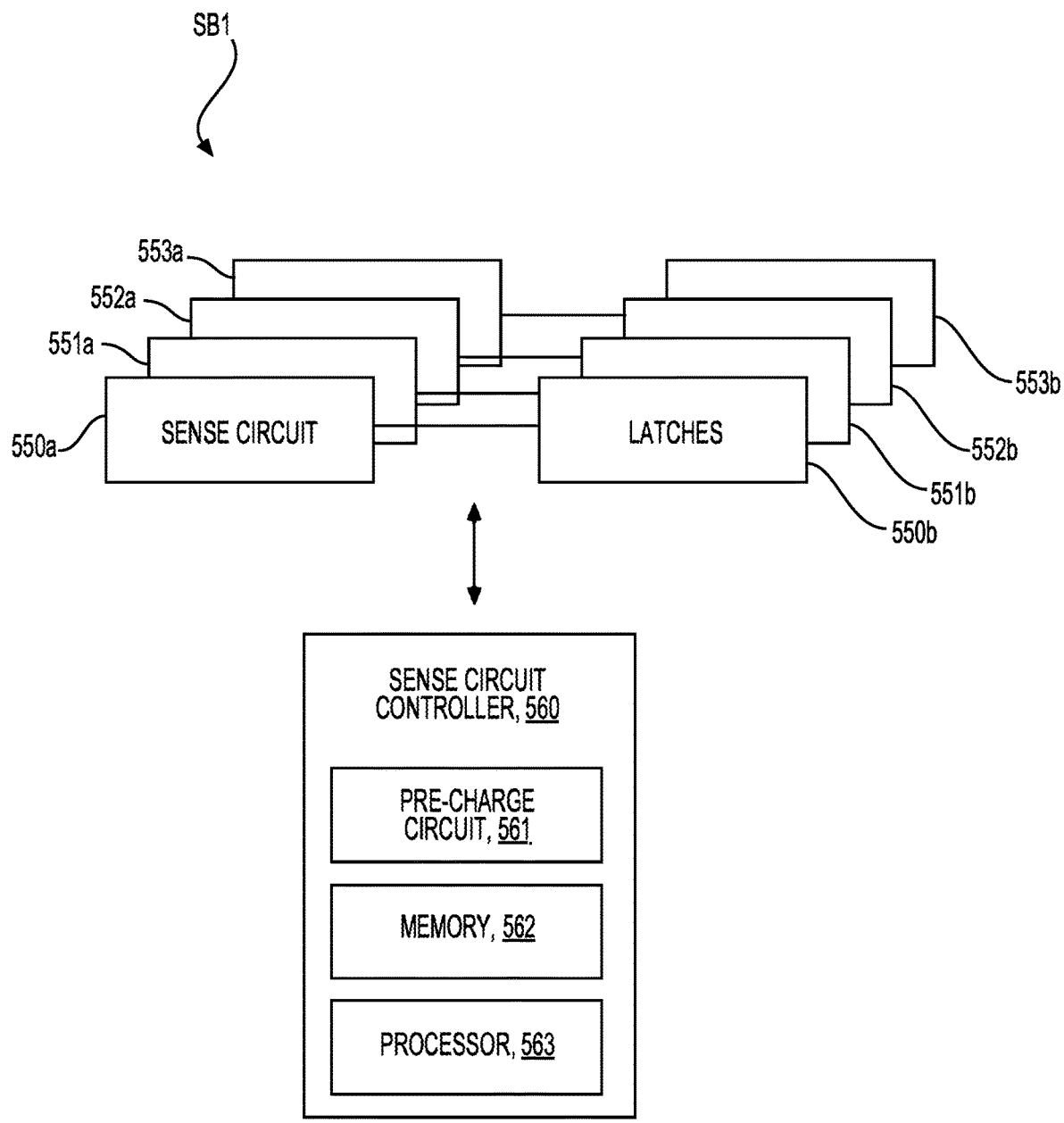
FIG. 5A - Prior Art

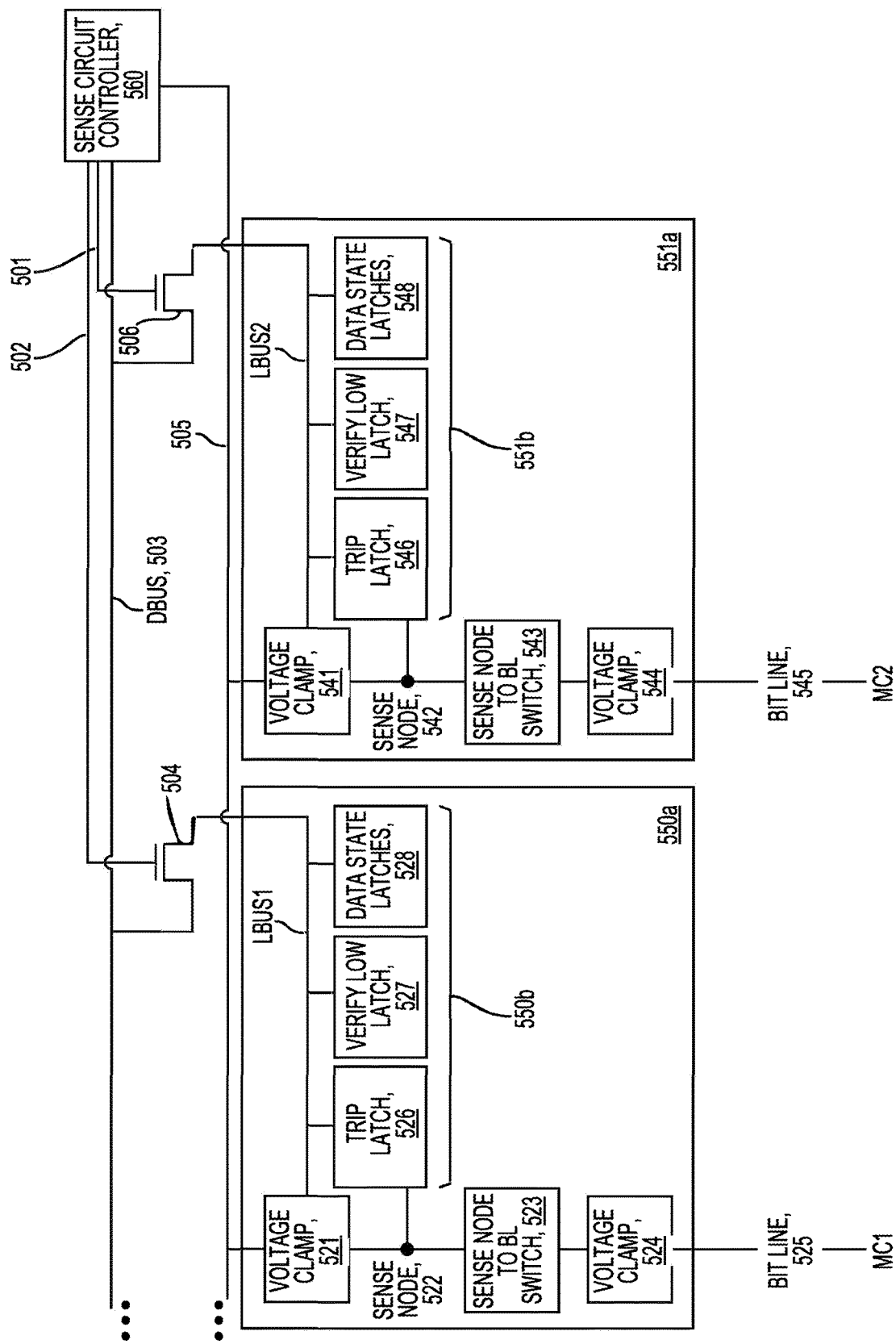
FIG. 5B - Prior Art

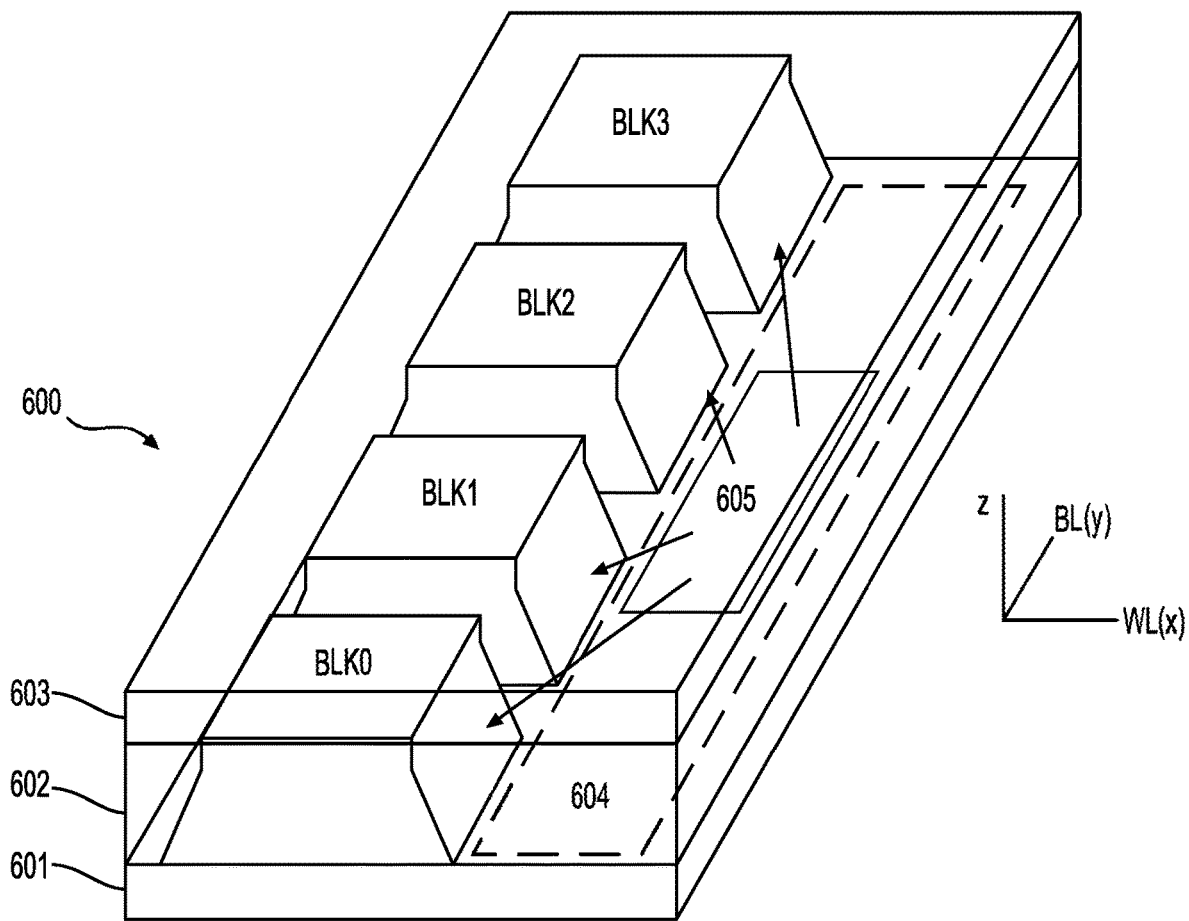
FIG. 6A - Prior Art

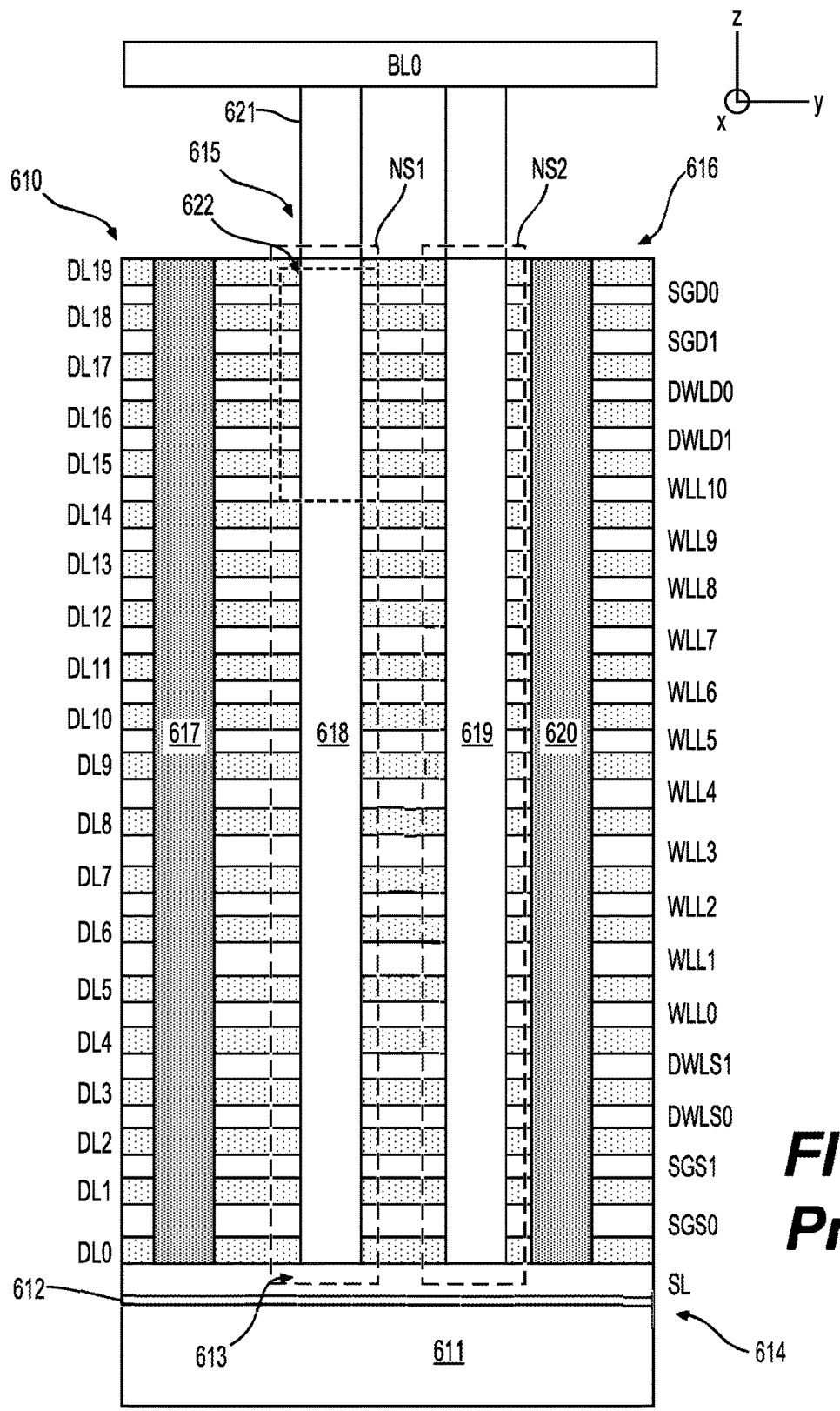
FIG. 6B - Prior Art

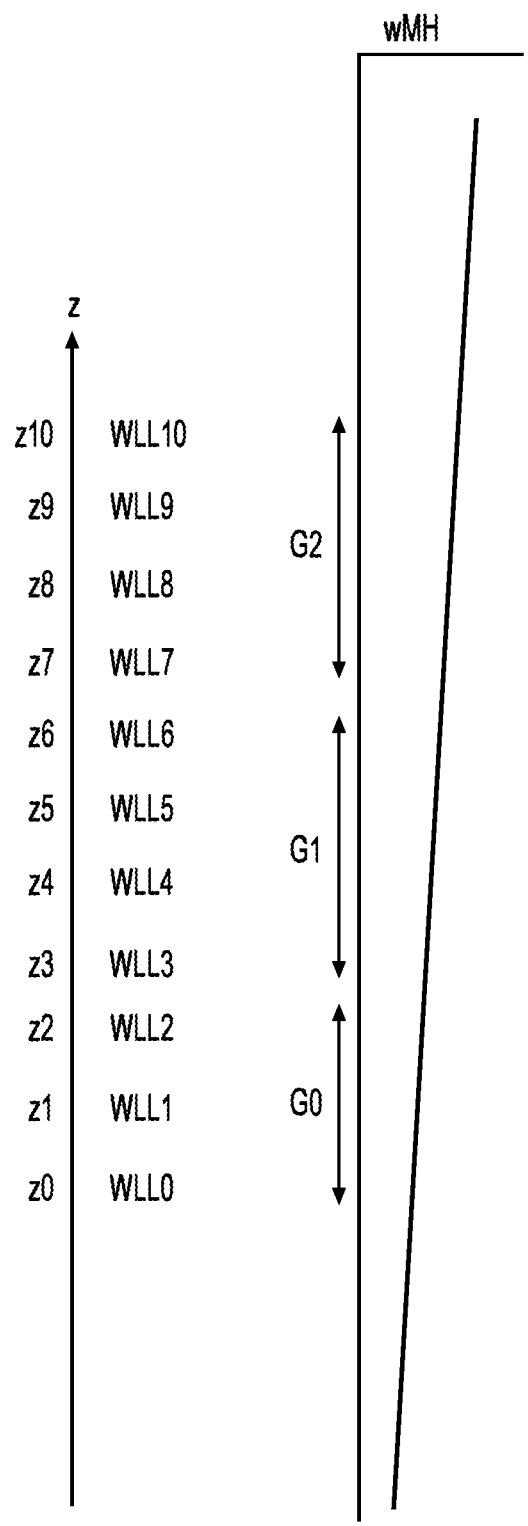
FIG. 6C - Prior Art

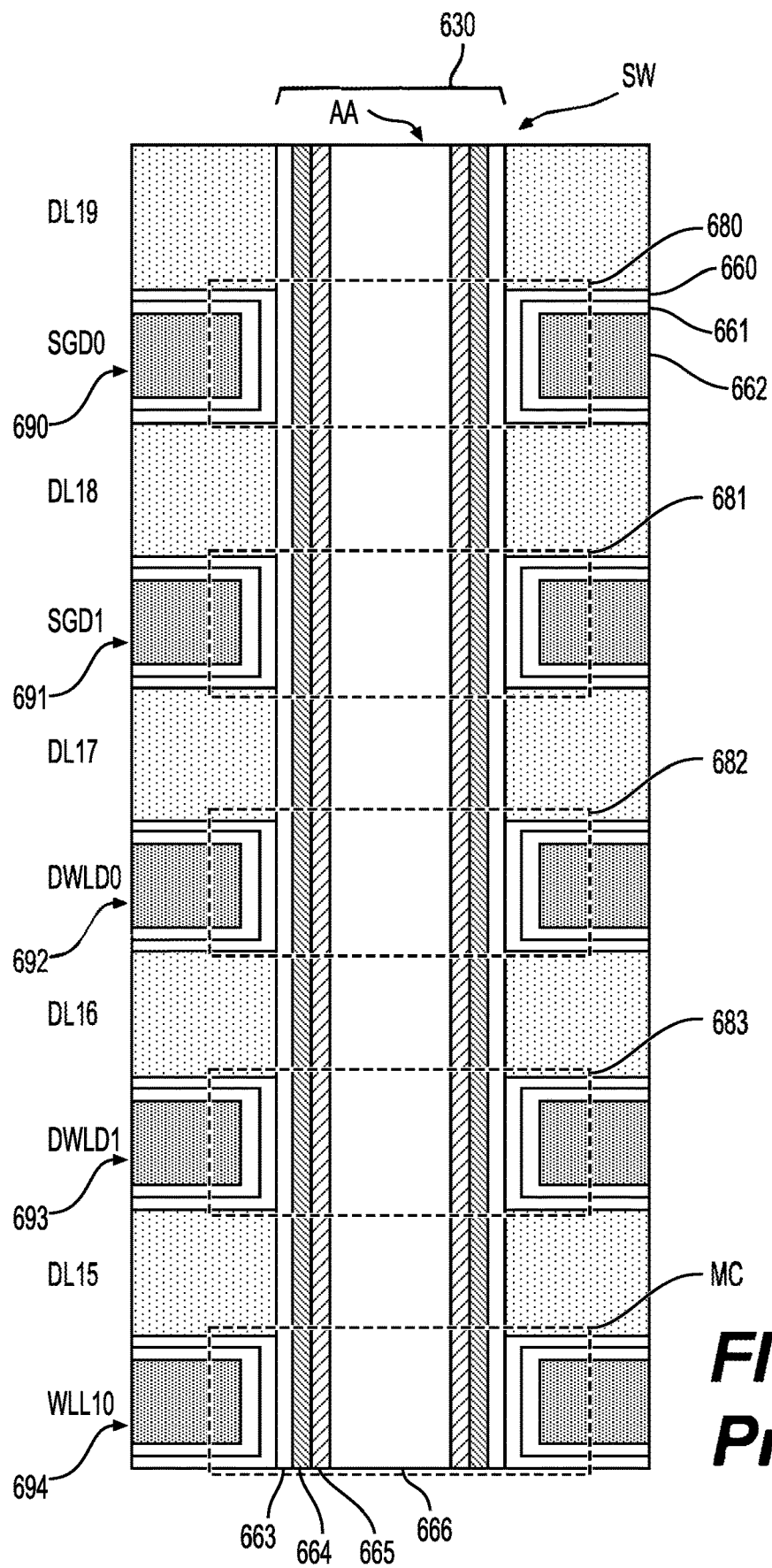
FIG. 6D - Prior Art

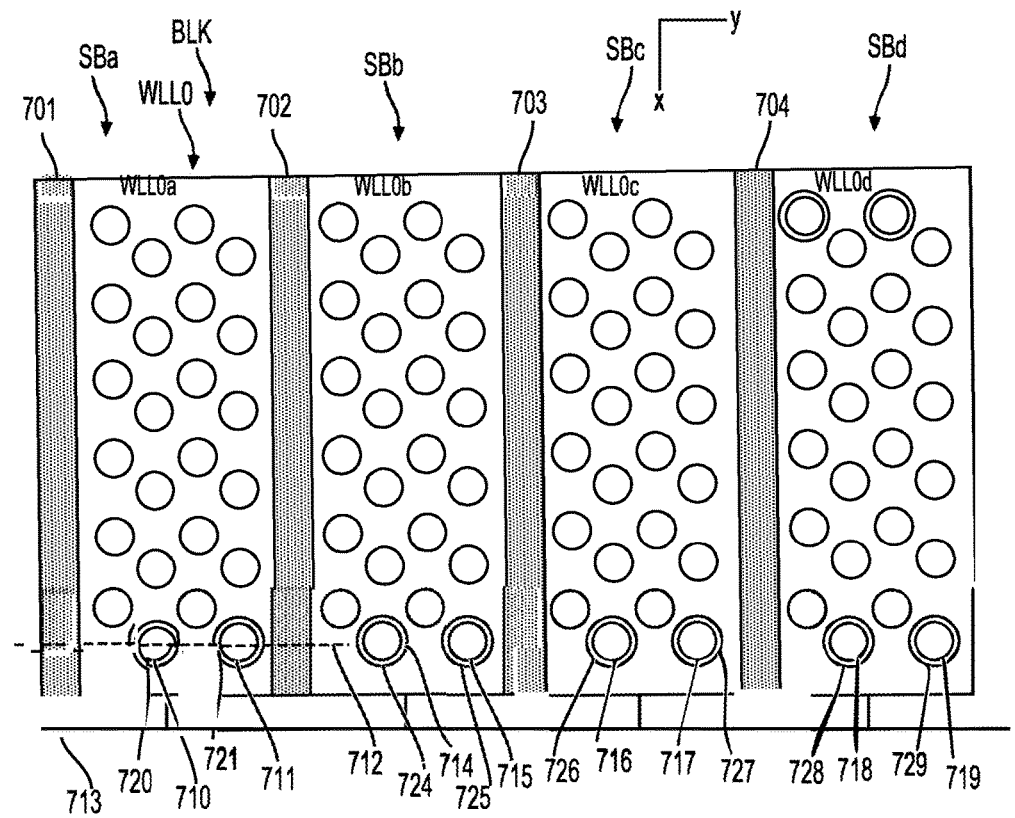
FIG. 7A - Prior Art
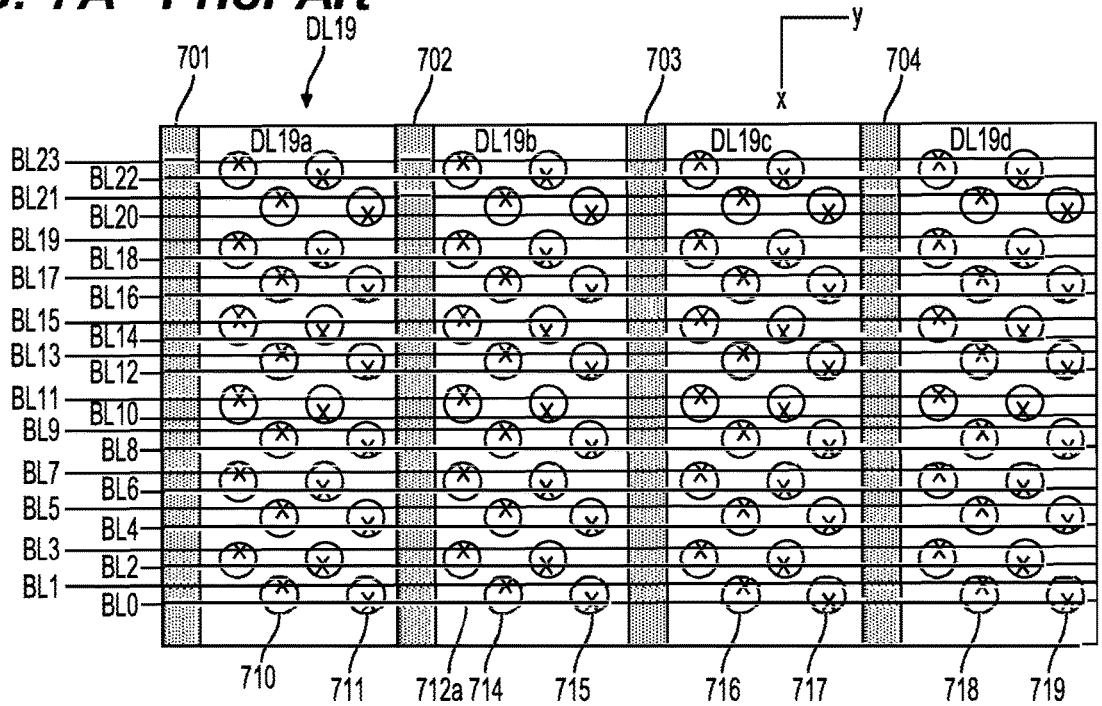
FIG. 7B - Prior Art

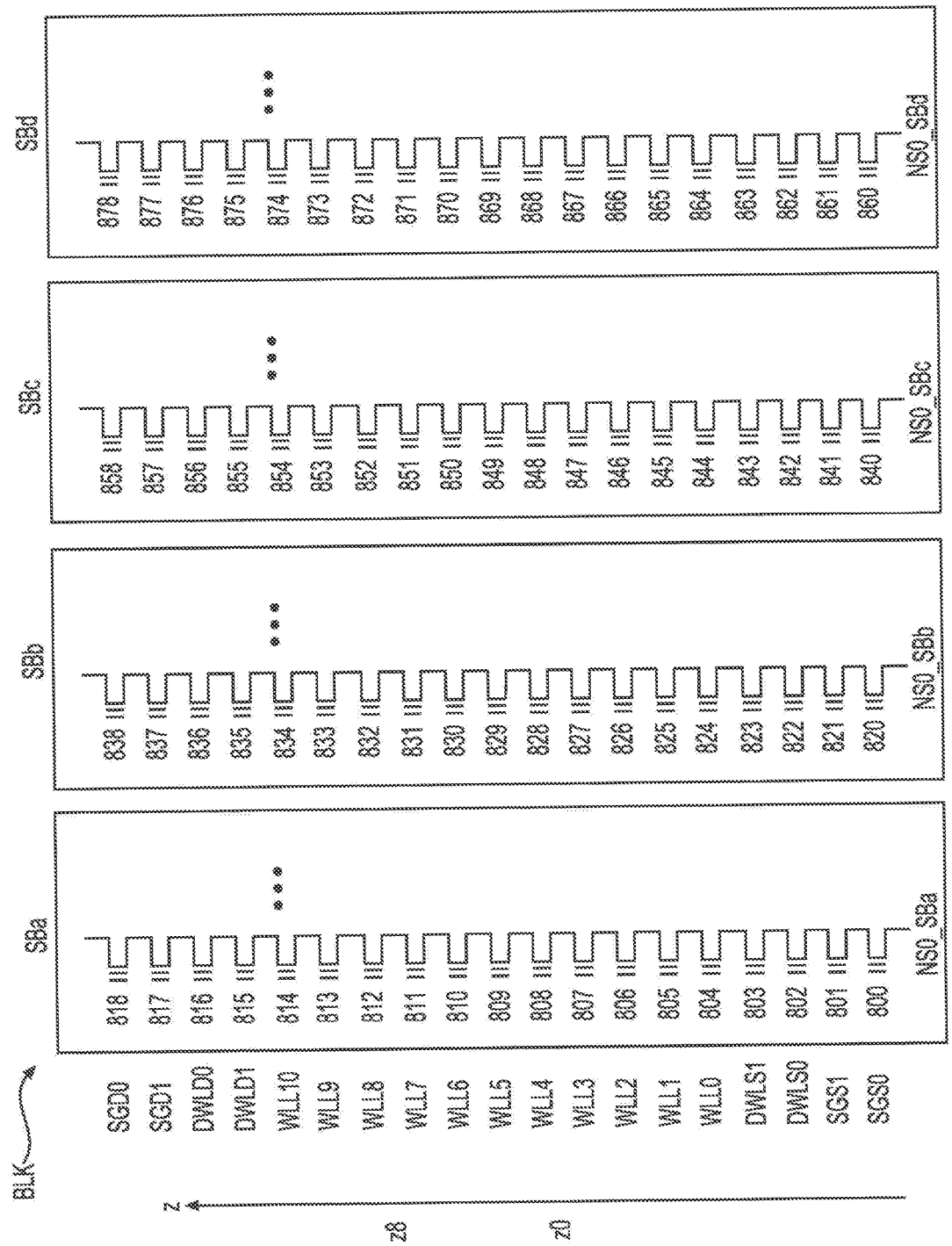
FIG. 8A - Prior Art

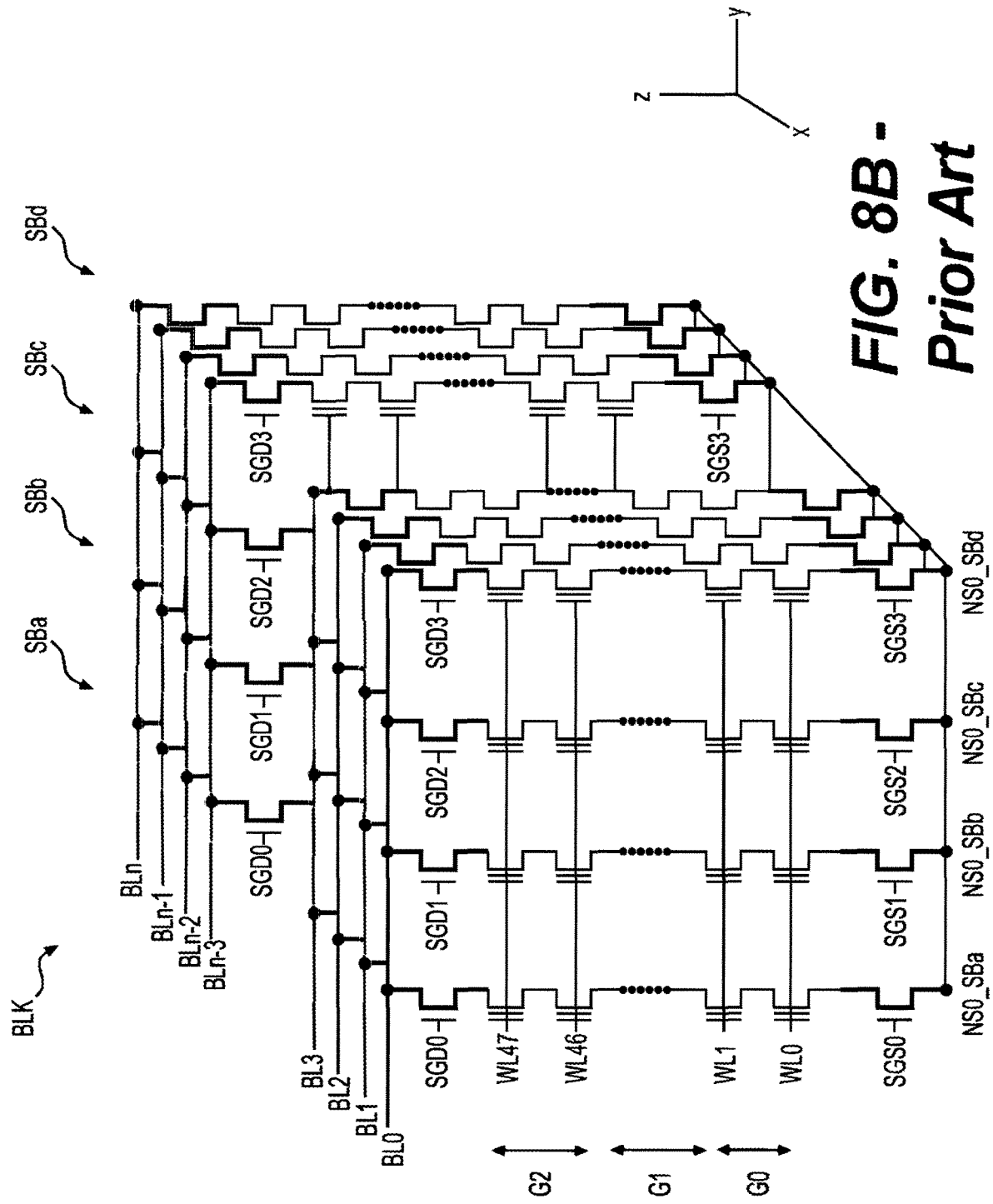
FIG. 8B - Prior Art

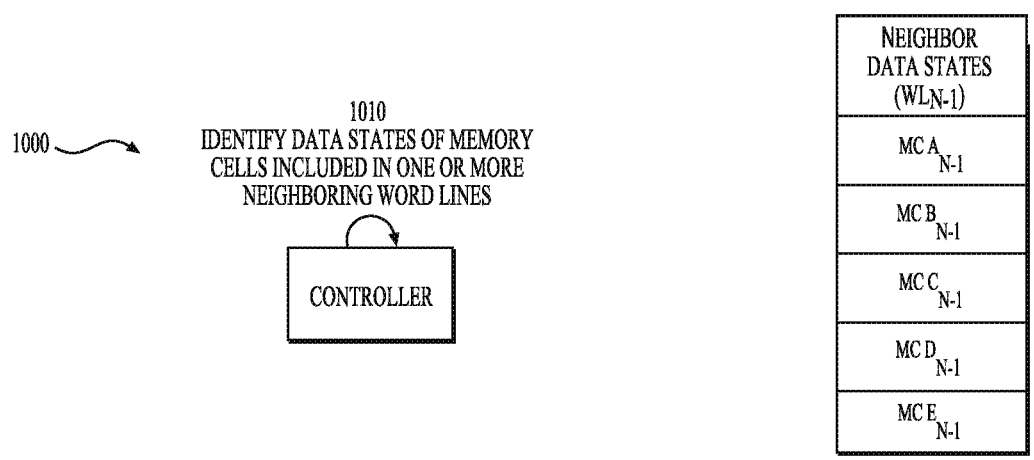
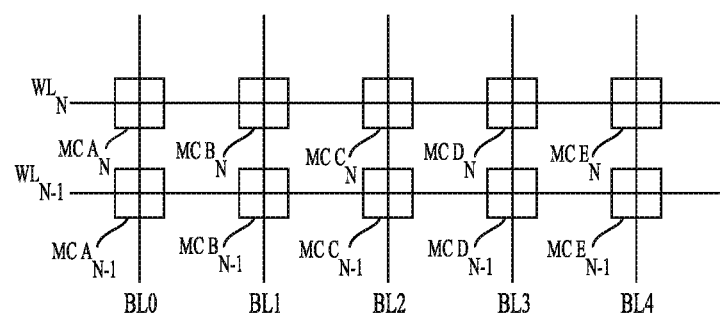
FIG. 10A

US 12,057,168 B2

NEIGHBOR AWARE MULTI-BIAS PROGRAMMING IN SCALED BICS

BACKGROUND

The present technology relates to the operation of memory devices.

Semiconductor memory devices are widely used in various electronic devices such as laptops, digital audio players, digital cameras, cellular phones, video game consoles, scientific instruments, industrial robots, medical electronics, solid state drives, automotive electronics, Internet of Things (IoT) devices and universal serial bus (USB) devices. Semiconductor memory includes both non-volatile and volatile memory. Non-volatile memory retains stored information without requiring an external power source. Examples of non-volatile memory include flash memory (e.g., NAND-type and NOR-type flash memory) and Electrically Erasable Programmable Read-Only Memory (EEPROM).

A memory device may be coupled to one or more hosts, where one or more interfaces are used to access the memory device. Additionally, the memory device is often managed by a controller, where among several roles, the controller is configured to interface between the host and the memory device.

SUMMARY

One aspect of the present invention is related to a storage device which includes a non-volatile memory and a controller. The non-volatile memory includes control circuitry and an array of memory cells formed using a set of word lines and a set of bit lines. The controller is coupled to the non-volatile memory and is configured to determine data states for a first set of memory cells, of the array of memory cells, that are part of a logical N–1 neighboring word line that is adjacent to a selected word line. The controller is also configured to determine, based on the data states, a program voltage configuration that includes at least two bit line voltage biases or at least two sense times. The controller is also configured to perform a program operation on the selected word line by using the program voltage configuration to iteratively program respective memory cells, of a second set of memory cells that are part of the selected word line. Determining the data states, determining the program voltage configuration, and performing the program operation may be to be repeated until a program stop condition is satisfied.

Another aspect of the present invention is related to a method of programming an array of memory cells formed using a set of word lines and a set of bit lines. The method includes the step of determining data states for a first set of memory cells, of the array of memory cells, that are part of a logical N–1 neighboring word line that is adjacent to a selected word line. The method further includes the step of determining bit line voltage biases based on the data states. The method further includes the step of performing, using the bit line voltage biases, a program operation on the selected word line to iteratively program respective memory cells, of a second set of memory cells that are part of the selected word line. Determining the data states, determining the program voltage configuration, and performing the program operation may be repeated until a program stop condition is satisfied.

Yet another aspect of the present invention is related to a flash memory device including an array of memory cells formed using a set of word lines and a set of bit lines and control circuitry coupled to the array of memory cells. The control circuitry is configured to determine data states for a first set of memory cells, of the array of memory cells, that are part of a logical N–1 neighboring word line that is adjacent to a selected word line. The control circuitry is further configured to determine, based on the data states, at least two sense times to be used for discharging sense nodes of a second set of memory cells included in a selected word line. The control circuitry is further configured to perform a program operation on the selected word line by using the program voltage configuration to iteratively program respective memory cells of the second set of memory cells. Determining the data states, determining the program voltage configuration, and performing the program operation may be repeated until a program stop condition is satisfied.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 1A is a block diagram of an example memory device.

FIG. 1B is a block diagram of an example control circuit which comprises a programming circuit, a counting circuit, and a determination circuit.

FIG. 2 illustrates blocks of memory cells in an example two-dimensional configuration of the memory array of FIG. 1.

FIG. 3A illustrates a cross-sectional view of example floating gate memory cells in NAND strings.

FIG. 3B illustrates a cross-sectional view of the structure of FIG. 3A along line 329.

FIG. 4A illustrates a cross-sectional view of example charge-trapping memory cells in NAND strings.

FIG. 4B illustrates a cross-sectional view of the structure of FIG. 4A along line 429.

FIG. 5A illustrates an example block diagram of the sense block SB1 of FIG. 1.

FIG. 5B illustrates another example block diagram of the sense block SB1 of FIG. 5A.

FIG. 6A is a perspective view of a set of blocks in an example three-dimensional configuration of the memory array of FIG. 1.

FIG. 6B illustrates an example cross-sectional view of a portion of one of the blocks of FIG. 6A.

FIG. 6C illustrates a plot of memory hole diameter in the stack of FIG. 6B.

FIG. 6D illustrates a close-up view of the region 622 of the stack of FIG. 6B.

FIG. 7A illustrates a top view of an example word line layer WLL0 of the stack of FIG. 6B.

FIG. 7B illustrates a top view of an example top dielectric layer DL19 of the stack of FIG. 6B.

FIG. 8A illustrates example NAND strings in the sub-blocks SBa–SBd of FIG. 7A.

FIG. 8B illustrates another example view of NAND strings in sub-blocks.

FIGS. 10A and 10B illustrate an example iteration 1000 of a program operation that uses adjusted bit line biases or adjusted sense times to compensate for neighboring word line interference (NWI) caused by neighboring memory cells of a logical neighboring word line ($WL_{n-1}$).

DETAILED DESCRIPTION

Figure 9:
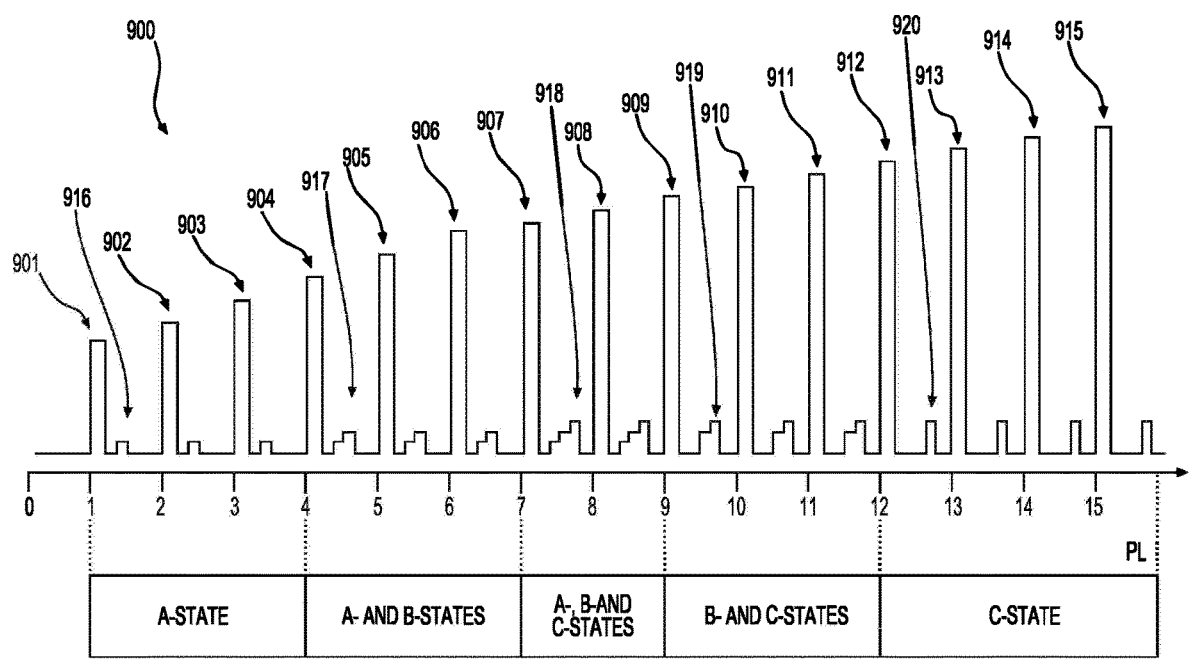
FIG. 9 illustrates the Vth distributions of memory cells in an example program-verify operation with at least four data states.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A program-verify operation for a set of memory cells typically involves applying a series of program voltages to the memory cells after the memory cells are provided in an erased data state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it may be locked out from further programming while programming continues for other memory cells in subsequent program loops. The program-verify operation may be a multistep program-verify operation, a full sequence or one-step program-verify operation, or another type of program-verify operation.

Each memory cell may be associated with a data state according to write data in a program command. A memory cell may be in an erased data state (referred to herein as an erased data state) or may be programmed to a programmed data state (referred to herein as a programmed data state) that is different from the erased data state. For example, in a two-bit per cell memory device, there are four data states including the erased data state and three programmed data states referred to as the A, B and C data states (see FIG. 9). In a three-bit per cell memory device, there are eight data states including the erased data state and seven programmed data states referred to as the A, B, C, D, E, F and G data states (see FIG. 10). In a four-bit per cell memory device, there are sixteen data states including the erased data state and fifteen programmed data states referred to as the Er, 1, 2, 3, 4, 5, 6, 7, 8, 9, A, B, C, D, E and F data states.

When a program command is issued, the write data is stored in latches associated with the memory cells. During programming, the latches of a memory cell may be read to determine the data state to which the cell is to be programmed. Each programmed data state is associated with a verify voltage such that a memory cell with a given data state is considered to have completed programming when a read (sense) operation determines its threshold voltage (Vth) is above the associated verify voltage. A read (sense) operation may determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and may be lower than the final verify voltage. When a memory cell is close to completion of programming, the programming speed of the memory cell may be reduced such as by elevating a voltage of a respective bit line during one or more subsequent program voltages. For example, in FIG. 9, a memory cell which is to be programmed to the A data state may be subject to verify tests at VvAL, an offset verify voltage of the A data state, and VvA, a final verify voltage of the A data state.

However, technological improvements have reduced the size of memory circuitry and related hardware, thereby making it difficult to efficiently program the memory cells. For example, by decreasing the size of memory circuitry and related hardware, more memory cells may be placed within a memory architecture. The ON pitch shrinking that occurs reduces the amount of physical space between word lines. Consequently, when a memory cell is programmed, neighbor word line interference (NWI) from a neighboring memory cell may impact the program-verify operation, such that additional program-verify iterations are needed to complete programming of the memory cells.

Even before the memory cell in a selected word line is programmed, an erase state of the memory cell can be impacted by interference caused by parasitic injection. For example, parasitic injection between the CTL causes a parasitic resistance drop of a bit line voltage used when programming a logical neighboring word line $WL_{n-1}$. The logical neighboring word line $WL_{n-1}$ may be a physical neighboring word line $WL_{n-1}$ in a normal order programming (NOP) scheme or a physical neighboring word line $WL_{n+1}$ in a reverse order programming (ROP) scheme. Interference caused by programming the logical neighboring word line $WL_{n-1}$ can reduce voltage of the memory cells in the selected word line. This causes a natural threshold voltage distribution (NVD) split to occur (e.g., before a program-verify operation is performed). For example, if a first threshold voltage distribution (Vth) represents a distribution unaffected by the interference, a second threshold voltage distribution (Vth) may represent a distribution affected by the interference (and will be "shifted" upward if illustrated in a graph).

Moreover, in ROP the erase state of the memory cell receives more interference from a logical neighboring word line $WL_{n-1}$ than a logical neighboring word line $WL_{n+1}$ because parasitic resistance is felt more on the drain side than on the source side of the memory cell. Furthermore, the erase state of the memory cell receives more interference from the parasitic injection when a neighboring memory cell is in a programmed data state than when the neighboring memory cell is in an erased data state.

One or more systems and/or methods, described herein, may include a storage device to perform a program operation on a selected word line $WL_n$ in a manner that compensates for interference caused by one or more neighboring memory cells of a logical neighboring word line $WL_{n-1}$. By compensating for interference caused by one or more neighboring memory cells, systems and/or methods described herein create narrower Vth distributions during the program operation. This allows selective verifications during the verify operation to be skipped, thereby reducing program execution time and a program loop count (e.g., a number of iterations to complete the program-verify operation). Additionally, resources (e.g., power resources, processing resources, memory resources, and/or the like) are conserved that would otherwise be wasted performing additional verify operations, performing less efficient program operations that cause Vth widening to occur, and/or the like.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, ..., SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller 122 and the one or more memory die 108 via lines 118.

The memory structure may be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It may include drivers for word lines, SGS and SGD transistors and source lines. The sense blocks may include bit line drivers, in one approach. An SGS transistor is a select gate transistor at a source end of a NAND string, and an SGD transistor is a select gate transistor at a drain end of a NAND string.

In some embodiments, some of the components may be combined. In various designs, one or more of the components (alone or in combination), other than memory structure 126, may be thought of as at least one control circuit which is configured to perform the actions described herein. For example, a control circuit may include any one of, or a combination of, control circuitry 110, state machine 112, decoders 114/132, power control module 116, sense blocks SBb, SB2, ..., SBp, read/write circuits 128, controller 122, and so forth.

The control circuits may include a programming circuit configured to perform a program-verify operation for one set of memory cells, wherein: the one set of memory cells comprises memory cells assigned to represent one data state among a plurality of data states and memory cells assigned to represent another data state among the plurality of data states; the program-verify operation comprising a plurality of program-verify iterations; and in each program-verify iteration, the programming circuit performs programming for the one word line after which the programming circuit applies a verification signal to the one word line. The control circuits may also include a counting circuit configured to obtain a count of memory cells which pass a verify test for the one data state. The control circuits may also include a determination circuit configured to determine, based on an amount by which the count exceeds a threshold, a particular program-verify iteration among the plurality of program-verify iterations in which to perform a verify test for the another data state for the memory cells assigned to represent the another data state.

For example, FIG. 1B is a block diagram of an example control circuit 150 which comprises a programming circuit 151, a counting circuit 152 and a determination circuit 153. The programming circuit may include software, firmware and/or hardware which implements, e.g., steps shown in FIG. 13.

The off-chip controller 122 may comprise a processor 122c, storage devices (memory) such as ROM 122a and RAM 122b and an error-correction code (ECC) engine 245. The ECC engine may correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the off-chip controller 122 may access code from a storage device 126a of the memory structure, such as a reserved area of memory cells in one or more word lines.

For example, code may be used by the off-chip controller 122 to access the memory structure such as for programming, read and erase operations. The code may include boot code and control code (e.g., set of instructions). The boot code is software that initializes the off-chip controller 122 during a booting or startup process and enables the off-chip controller 122 to access the memory structure. The code may be used by the off-chip controller 122 to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the off-chip controller 122. The control code includes drivers to perform basic tasks such as controlling and allocating memory, prioritizing the processing of instructions, and controlling input and output ports.

Generally, the control code may include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory may also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which may also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices may be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions may also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations may be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories may be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2 illustrates blocks of memory cells in an example two-dimensional configuration of the memory array 126 of FIG. 1. The memory array may include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, may also be used in the memory array adjacent to the select gate transistors. Such dummy word lines may shield the edge data word line from certain edge effects.

One type of non-volatile memory which may be provided in the memory array is a floating gate memory. See FIGS. 3A and 3B. Other types of non-volatile memory may also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell may be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate may be used to store charge, or a thin charge trap layer may be used to trap charge. This approach may avoid the issue of ballistic electron transport, where an electron may travel through the floating gate after tunneling through the tunnel oxide during programming.

FIG. 3B illustrates a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer may be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A illustrates a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory may be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer may be made thinner than a floating gate. Additionally, the memory cells may be placed closer together.

FIG. 4B illustrates a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer may be a stack of high-k dielectrics such as AlOx or HfOx which help increase the coupling ratio between the control gate layer and the charge-trapping or charge storing layer. The charge-trapping layer may be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 may be removed, exposing a top surface of the channel 406.

FIG. 5A illustrates an example block diagram of the sense block SB1 of FIG. 1. In one approach, a sense block comprises multiple sense circuits. Each sense circuit is associated with data latches. For example, the example sense circuits 550a, 551a, 552a and 553a are associated with the data latches 550b, 551b, 552b and 553b, respectively. In one approach, different subsets of bit lines may be sensed using different respective sense blocks. This allows the processing load which is associated with the sense circuits to be divided up and handled by a respective processor in each sense block. For example, a sense circuit controller 560 in SB1 may communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller 560 may also include a memory 562 and a processor 563. As mentioned also in connection with FIG. 2, the memory 562 may store code which is executable by the processor to perform the functions described herein. These functions may include reading latches which are associated with the sense circuits, setting bit values in the latches and providing voltages for setting pre-charge levels in sense nodes of the sense circuits. Further example details of the sense circuit controller 560 and the sense circuits 550a and 551a are provided below.

FIG. 5B illustrates another example block diagram of the sense block SB1 of FIG. 1. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage may decay. The bit line 525 is connected to one or more memory cells such as a memory cell MC1. A voltage clamp 524 may set a voltage on the bit line, such as during a sensing operation or during a program voltage. A local bus, LBUS1, allows the sense circuit controller 560 to communicate with components in the sense circuit, such as the latches 550b and the voltage clamp in some cases. To communicate with the sense circuit 550a, the sense circuit controller 560 provides a voltage via a line 502 to a transistor 504 to connect LBUS1 with a data bus DBUS, 503. The communicating may include sending data to the sense circuit and/or receive data from the sense circuit.

The sense circuit controller 560 may communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 may set a voltage on the bit line. The bit line 545 is connected to one or more memory cells such as a memory cell MC2. A local bus, LBUS2, allows the sense circuit controller 560 to communicate with components in the sense circuit, such as the latches 551b and the voltage clamp in some cases. To communicate with the sense circuit 551a, the sense circuit controller 560 provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry may include voltage drivers 605 which may be connected to control gate layers of the blocks. In one approach, control gate layers at a common height in the blocks are commonly driven. The substrate 601 may also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks may be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 6B illustrates an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width may vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells may vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups may have different optimized verify operations.

FIG. 6D illustrates a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers may be deposited along the sidewall (SW) of the memory hole 630 and/or within each word line layer, e.g., using atomic layer deposition. For example, each column (e.g., the pillar which is formed by the materials within a memory hole) may include a charge-trapping layer or film 663 such as SiN or other nitride, a tunneling layer 664, a polysilicon body or channel 665, and a dielectric core 666. A word line layer may include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers may be in the control gate layer. Additional pillars are similarly formed in the different memory holes. A pillar may form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes may be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string may be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WLL0 of the stack of FIG. 6B. As mentioned, a 3D memory device may comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device may be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. Further, a word line layer in a block may be divided into regions. Each region is in a respective sub-block are may extend between slits which are formed periodically in the stack to process the word line layers during the fabrication process of the memory device. This processing may include replacing a sacrificial material of the word line layers with metal. Generally, the distance between slits should be relatively small to account for a limit in the distance that an etchant may travel laterally to remove the sacrificial material, and that the metal may travel to fill a void which is created by the removal of the sacrificial material. For example, the distance between slits may allow for a few rows of memory holes between adjacent slits. The layout of the memory holes and slits should also account for a limit in the number of bit lines which may extend across the region while each bit line is connected to a different memory cell. After processing the word line layers, the slits may optionally be filed with metal to provide an interconnect through the stack.

This figures and other are not necessarily to scale. In practice, the regions may be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0 $a$, WLL0 $b$, WLL0 $c$ and WLL0 $d$ which are each connected by a connector 713. The last region of a word line layer in a block may be connected to a first region of a word line layer in a next block, in one approach. The connector, in turn, is connected to a voltage driver for the word line layer. The region WLL0 $a$ has example memory holes 710 and 711 along a line 712. The region WLL0 $b$ has example memory holes 714 and 715. The region WLL0 $c$ has example memory holes 716 and 717. The region WLL0 $d$ has example memory holes 718 and 719. The memory holes are also shown in FIG. 7B. Each memory hole may be part of a respective NAND string. For example, the memory holes 710, 714, 716 and 718 may be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0 $a$, memory cells 724 and 725 are in WLL0 $b$, memory cells 726 and 727 are in WLL0 $c$, and memory cells 728 and 729 are in WLL0 $d$. These memory cells are at a common height in the stack.

Metal-filled slits 701, 702, 703 and 704 (e.g., metal interconnects) may be located between and adjacent to the edges of the regions WLL0 $a$-WLL0 $d$. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B illustrates a top view of an example top dielectric layer DL19 of the stack of FIG. 6B. The dielectric layer is divided into regions DL19 $a$, DL19 $b$, DL19 $c$ and DL19 $d$. Each region may be connected to a respective voltage driver. This allows a set of memory cells in one region of a word line layer to be programmed concurrently, with each memory cell being in a respective NAND string which is connected to a respective bit line. A voltage may be set on each bit line to allow or inhibit programming during each program voltage.

The region DL19 $a$ has the example memory holes 710 and 711 along a line 712$a$ which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines may be numbered in a sequence BL0-BL23 across the DL19 layer in the -x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 8A illustrates example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the another set of memory cells (e.g., including the memory cell 812) connected to another word line (e.g., WLL8) are at another height (z8) in the stack.

FIG. 8B illustrates another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

FIG. 9 illustrates a waveform of an example program-verify operation. The horizontal axis illustrates a program loop number and the vertical axis illustrates control gate or word line voltage. Generally, a program-verify operation may involve applying a pulse train to a selected word line, where the pulse train includes multiple program-verify (PV) iterations. The program portion of a PV iteration comprises a program voltage, and the verify portion of the PV iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming step in which the programming is completed. ISPP may also be used in each programming step of a multistep operation.

A pulse train typically includes program voltages which increase stepwise in amplitude in each program-verify iteration using a fixed of varying step size. A new pulse train may be applied in each programming step of a multistep program-verify operation, starting at an initial Vpgm level and ending at a final Vpgm level which does not exceed a maximum allowed level. The initial Vpgm levels may be the same or different in different programming steps. The final Vpgm levels may also be the same or different in different programming steps. The step size may be the same or different in the different programming steps. In some cases, a smaller step size is used in a final programming step to reduce Vth distribution widths.

The pulse train 900 includes a series of program voltages 901, 902, 903, 904, 905, 906, 907, 908, 909, 910, 911, 912, 913, 914 and 915 that are applied to a word line selected for programming, and an associated set of non-volatile memory cells. In the example shown, one, two, or three verify voltages are provided after each program voltage, for example, based on a number of target data states which are being verified. The number of target data states being verified may, for example, correspond to a number of memory cells associated with the word line. A program voltage and corresponding verify voltage may be separated by applying 0 V to the selected word line between the program voltage and the verify voltage.

In the example shown, an A-state verify voltage of VvA (e.g., waveform or programming signal 916) may be applied after each of the first, second and third program voltages 901, 902 and 903, respectively. A- and B-state verify voltages of VvA and VvB (e.g., programming signal 917) may be applied after each of the fourth, fifth and sixth program voltages 904, 905 and 906, respectively. A-, B- and C-state verify voltages of VvA, VvB and VvC (e.g., programming signal 918) may be applied after each of the seventh and eighth program voltages 907 and 908, respectively. B- and C-state verify voltages of VvB and VvC (e.g., programming signal 919) may be applied after each of the ninth, tenth and eleventh program voltages 909, 910 and 911, respectively. Finally, a C-state verify voltage of VvC (e.g., programming signal 1020) may be applied after each of the twelfth, thirteenth, fourteenth and fifteenth program voltages 912, 913, 914 and 915, respectively.

Figure 10B:
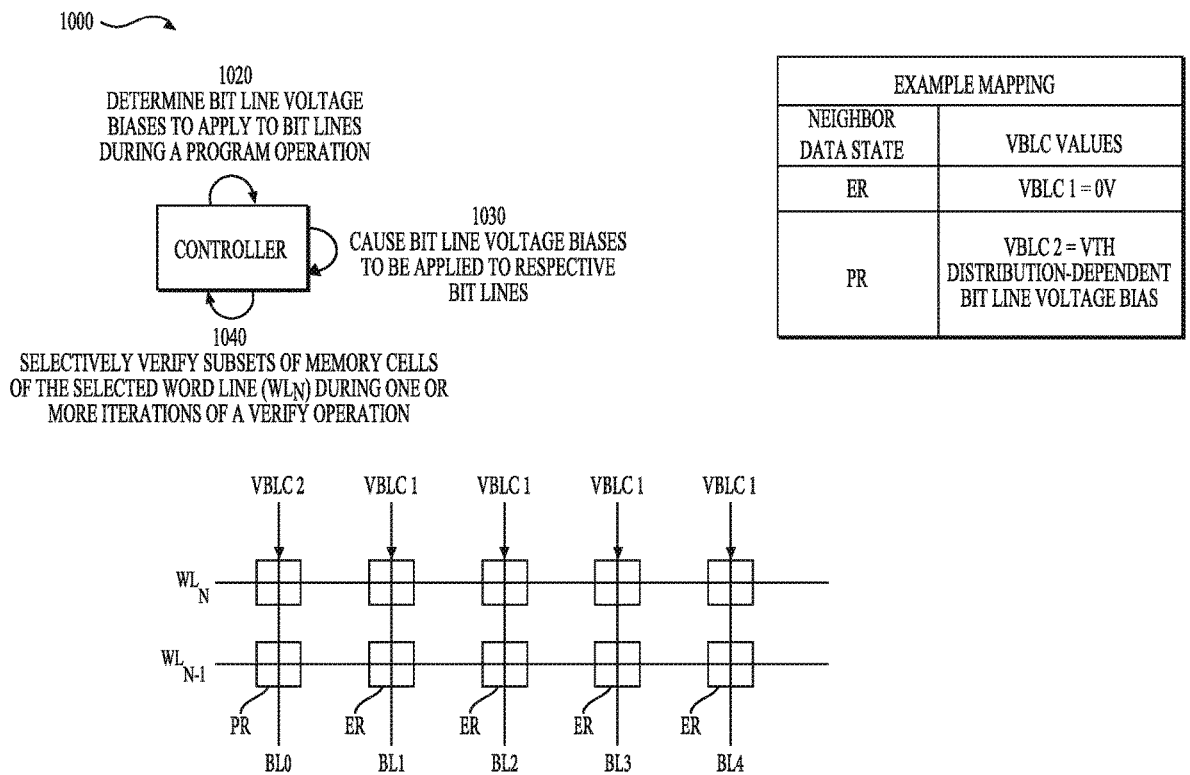

FIGS. 10A and 10B illustrate a controller (e.g., sense circuit controller 560, a controller or processor described in FIG. 1A, etc.) performing an example iteration 1000 of a program operation that utilizes normal order programming (NOP). For example, the controller may perform the program operation in a manner that biases a set of bit lines connecting to memory cells of a selected word line (referred to hereafter as selected $WL_n$). As shown, the memory cells of the selected $WL_n$ may include memory cell (MC) $A_n$, MC $B_n$, MC $C_n$, MC $D_n$, and MC $E_n$. The selected $WL_n$ may be parallel to a physical neighboring $WL_{n-1}$ (e.g., which may be the logical neighboring $WL_{n-1}$ described elsewhere herein). The physical neighboring $WL_{n-1}$ may include neighboring MC $A_{n-1}$, MC $B_{n-1}$, MC $C_{n-1}$, MC $D_{n-1}$, and MC $E_{n-1}$. The neighboring memory cells of $WL_{n-1}$ may, for example, correspond to the memory cells of $WL_n$. The bit lines connecting to respective word lines include bit line (BL) 0, BL 1, BL 2, BL 3, and BL 4.

As shown by reference number 1010 of FIG. 10A, the controller may identify data states of memory cells connecting to neighboring $WL_{n-1}$. For example, the controller may identify the data states of the memory cells included in each respective neighboring word line by performing one or more read operations (sometimes referred to as sense operations). The controller may, for example, perform a read operation to identify a data state of a memory cell of the physical neighboring $WL_{n-1}$ by referencing a data structure supported by a data state latch (e.g., data state latch 548).

The data structure may be used to store data state values for bits of neighboring memory cells (e.g., memory cells that are in the physical neighboring $WL_{n-1}$). A data state may include an erased data state (shown as ER) indicating that one or more bits of a memory cell have not been programmed or a programmed data state (showed as PR) indicating that the one or more bits have been programmed (e.g., to a value of zero or one).

Using a 4-bit memory cell architecture as an example, there may be one data state left in an erased data state ER and fifteen programmed data states (represented by data state A, data state B, . . . , data state O). In the example shown in FIG. 10A, a first data structure corresponding to memory cell $A_{n-1}$ may store data state values indicating that one or more bits of memory cell $A_{n-1}$ have been programmed, a second data structure corresponding to memory cell $B_{n-1}$ may store data state values indicating that one or more bits of memory cell $B_{n-1}$ have been programmed, a third data structure corresponding to memory cell $C_{n-1}$ may store data state values indicating that one or more bits of memory cell $C_{n-1}$ have been programmed, a fourth data structure corresponding to memory cell $D_{n-1}$ may store data state values indicating that one or more bits of memory cell $D_{n-1}$ have been programmed, a fifth data structure corresponding to memory cell $E_{n-1}$ may store data state values indicating that one or more bits of memory cell $E_{n-1}$ have been programmed.

In some embodiments, performing a read operation may include identifying one or more data states for a memory cell of the physical neighboring $WL_{n-1}$. In some embodiments, performing the read operation may include identifying data states for multiple memory cells of the physical neighboring $WL_{n-1}$. In some embodiments, performing the read operation may include identifying data states for multiple memory cells of multiple neighboring word lines (e.g., the physical neighboring $WL_{n-1}$, the second neighboring word line $WL_{n+1}$, etc.). In some embodiments, multiple separate read operations may be performed. For example, a first read operation may be performed to identify data states corresponding to BL 1 and BL 3 and a second read operation may be performed to identify data states corresponding to BL 2 and BL 4. This prevents two adjacent bit lines from being read simultaneously and the bit lines that are not read may be grounded to provide shielding between the bit lines being read. This reduces bit line-to-bit line coupling that can occur as a result of the voltage level on the bit lines changing during the read operation.

In the example shown, the controller may perform a read operation to identify that MC $A_{n-1}$, MC $B_{n-1}$, MC $C_{n-1}$, MC $D_{n-1}$, and MC $E_{n-1}$, have data states PR, ER, ER, ER, and ER, respectively.

By identifying the data states of memory cells included in the physical neighboring $WL_{n-1}$, the controller may determine bit line voltage biases for the program operation to be performed on the selected word line $WL_n$, such that the bit line voltage biases may be used to offset an interference that the memory cells in the physical neighboring $WL_{n-1}$ would otherwise have on the memory cells of the selected word line $WL_n$.

As shown by in FIG. 10B by reference number 1020, the controller may determine bit line voltage biases to apply to bit lines connecting to the selected $WL_n$ (e.g., as part of the program operation). For example, the controller may determine bit line voltage biases to apply to bit lines connecting to the selected $WL_n$ based on whether the identified data states of the neighboring memory cells are in programmed data states or erased data states.

In some embodiments, the controller may determine one or more bit line voltage biases by referencing a data structure that maps data state values with bit line voltage bias values. In some embodiments, as shown, the data structure may map data state values with bit line voltage bias values. Because the data structure maps the data state values of the neighboring memory cells with particular bit line voltage bias values, the controller may use the identified data state values (and/or, a selected word line identifier) to reference the mapping of the data structure to determine the bit line voltage biases to select for the program operation.

In some embodiments, a higher bit line voltage bias value may be mapped to a data state or data state combination based on the data state (or at least part of the combination of data states) being in a programmed data state. A lower bit line voltage bias value may be mapped to a data state or data state combination based on the data state (or at least a portion of the data state combination) being in an erased data state. This is because the impact that the interference that neighboring memory cells will have on memory cells of the selected $WL_n$ will be greater for neighboring memory cells that have programmed data states than for neighboring memory cells that have erased data states. Thus, a first bit line voltage bias value corresponding to an erased data state may be assigned a lower voltage value than a second bit line voltage bias value corresponding to a programmed data state.

In some embodiments, the first bit line voltage bias value may be zero (e.g., indicative of zero volts). Additionally, or alternatively, the second bit line voltage bias value may have a value dependent upon a threshold voltage (Vth) distribution for the selected word line, as will be further described in FIGS. 11A and 11B. As shown as an example, a first bit line voltage bias value (shown as VBLC 1) may be mapped to a first data state (shown as ER) and a second bit line voltage bias value (shown as VBLC 2) may be mapped one or more programmed data states (shown as PR).

As shown by reference number 1030, the controller may cause the bit line voltage biases to be applied to respective bit lines connecting to the selected word line $WL_n$. For example, the controller may provide the bit line voltage biases to the bit lines connecting to the selected $WL_n$.

In some embodiments, such as when the program operation is part of a multistep program-verify operation, the controller may apply a default bit line voltage bias during an initial iteration of the program operation and may apply the determined bit line voltage biases to each respective bit line during subsequent iterations of the program operation. In this case, the controller may, during each iteration of the program operation, cause the bit line voltage biases to be applied to the bit lines. Furthermore, application of the bit line voltage biases creates a natural Vth distribution (NVD) of the selected word line at a time after the neighboring $WL_{n-1}$ is programmed, where the NVD of the selected $WL_n$ aligns with a corresponding NVD of the selected $WL_n$ at a time prior to the neighboring $WL_{n-1}$ being programmed.

In the example shown, the controller may cause VBLC 2 to be applied to BL 0 and VBLC 1 to be applied to BL 1, BL 2, BL 3, and BL 4, respectively. VBLC 2 may be provided to BL 0 based on MC $A_n$ being adjacent to neighboring MC $A_{n-1}$, which has a programmed data state. The bit line voltage biases, when applied to the bit lines, may cause changes in control gate voltages (VCGs) provided to control gates of each respective memory cell in the selected bit line.

Additionally, or alternatively, the controller may provide a program voltage (Vpgm) to the memory cells in the selected $WL_n$. For example, during a first iteration of the program operation, the controller may determine a modified default program voltage by adding a default program voltage (Vpgm$_u$) and a compensation voltage that is indicative of an NVD split at a given time. This may allow the controller to apply the modified default program voltage to program the memory cells. However, because of the bit line voltage biases that have been applied, resulting Vth distributions will not have an NVD split or will have a greatly reduced NVD split (e.g., relative to not biasing the bit lines).

As shown by reference number 1040, the controller may, during one or more iterations of a verify operation, selectively verify subsets of memory cells of the selected word line. For example, during a first or second iteration of a verify operation, the controller may attempt to verify only the first few memory cells of the selected word line. Similarly, during a final iteration or penultimate iteration of the verify operation, the controller may attempt to verify only the last few memory cells of the selected word line. In some embodiments, the controller may perform verifications for particular memory cells at select intervals (e.g., every other iteration, every third iteration, etc.). This is because applying the bit line voltage biases during the program operation eliminated or reduced interference caused by the neighboring $WL_{n-1}$. This allows the controller reduce a frequency at which each respective verification is to be performed (e.g., relative to a verification operation that is unable to effectively compensate for the interference caused by the neighboring $WL_{n-1}$).

While only one iteration of the program operation is shown, it is to be understood that this is provided by way of example, and that in practice, the determined bit line voltage biases may be applied to multiple iterations of the program operation. Examples illustrating this are provided in connection with FIG. 11B.

In some embodiments, the controller may determine sense times to adjust threshold voltage (Vth) of memory cells of the selected $WL_n$. For example, rather than determine the bit line voltage biases, the controller may determine sense times to control discharge voltage (e.g., from pre-charge voltages (PVCs)) that affect threshold voltages of the memory cells of the selected word line while the program operation is being performed. A sense time may, for example, indicate a duration during which a capacitor can charge a sense node of a memory cell that corresponds to a bit line connecting to the selected word line. This allows the control to use the sense times to program the memory cells of the selected word line in a manner that compensates for interference caused by the neighboring $WL_{n-1}$.

In some embodiments, the controller may determine sense times based on whether neighboring memory cells are in an erased data state or a programmed data state. For example, a different sense time may be mapped to a data state (or data state combination) based on the data state being a programmed data state (or if at least one of the combination of data states is a programmed data state) or an erased data state. This is because the impact that the interference of the neighboring $WL_{n-1}$ will have on the memory cells of the selected word line will be greater for neighboring memory cells in programmed data states than for neighboring memory cells in erased data states.

By applying the bit line voltage biases (or the PVCs) to the bit lines, the controller reduces or eliminates an impact of interference that the neighboring $WL_{n-1}$ has on the selected word line, reduces or eliminates an NVD split, conserves resources (e.g., processing resources, memory resources, etc.) by performing less verifications relative to a program-verify operation that is unable to effectively compensate for interference caused by the neighboring $WL_{n-1}$, and/or the like.

Figure 11A:
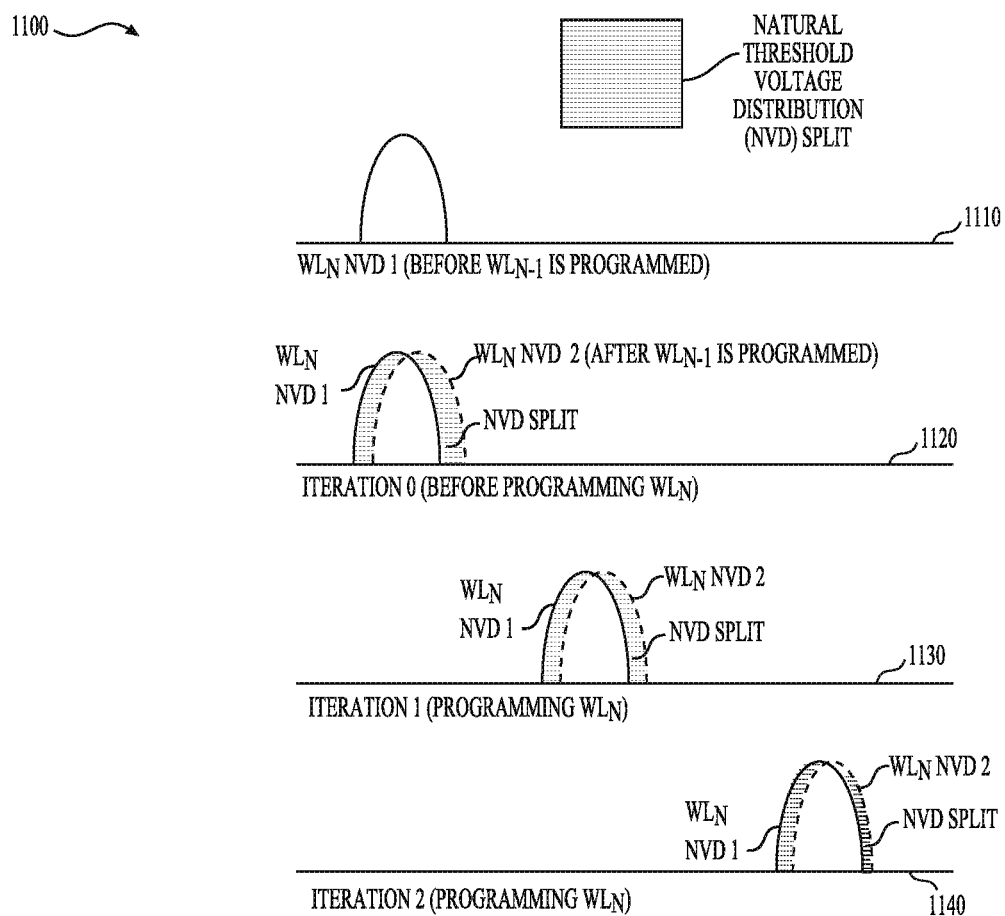
FIG. 11A illustrates a natural Vth distribution (NVD) split caused by the interference of a neighboring $WL_{n-1}$.

FIG. 11A illustrates a natural Vth distribution (NVD) split caused by the interference of the neighboring $WL_{n-1}$. An NVD split may refer to a difference between a default Vth distribution of the selected $WL_n$ (e.g., had there been no interference by the neighboring $WL_{n-1}$) and a Vth distribution of the selected $WL_n$ that is impacted by interference from the neighboring $WL_{n-1}$. As shown by reference number 1110, when a block is erased, a first $WL_n$ NVD (shown as $WL_n$ NVD 1) is created. The first $WL_n$ NVD may represent a Vth distribution prior to the controller programming the selected $WL_n$.

As shown by reference number 1120, a $WL_n$ NVD split may be created based on neighboring word line interference (NWI) from the neighboring $WL_{n-1}$. For example, after the neighboring $WL_{n-1}$ is programmed, but before the selected $WL_n$ is programmed, a $WL_n$ NVD split may be created that includes the first $WL_n$ NVD and a second $WL_n$ NVD (shown as $WL_n$ NVD 2). The amount of shift between $WL_n$ NVDs may be based on whether respective memory cells of the neighboring $WL_{n-1}$ are in erased data states or programmed data states. For example, a shift that occurs when memory cells of the neighboring $WL_{n-1}$ are in a programmed data state may be greater than a shift that occurs when the memory cells of the neighboring $WL_{n-1}$ are in an erased data state. In the example shown, the NVD split is shown by the grey shaded region between the first $WL_n$ NVD and the second $WL_n$ NVD.

As shown by reference number 1130, a first iteration of the program operation may cause each $WL_n$ NVD to shift to the right. As shown by reference number 1140, a second iteration of the program operation may cause each $WL_n$ NVD to shift further to the right. As shown, the NVD split remains during each respective iteration of the program operation (e.g., while separation between NVDs reduces with each iteration, it remains in a scaled ON pitch).

Figure 11B:
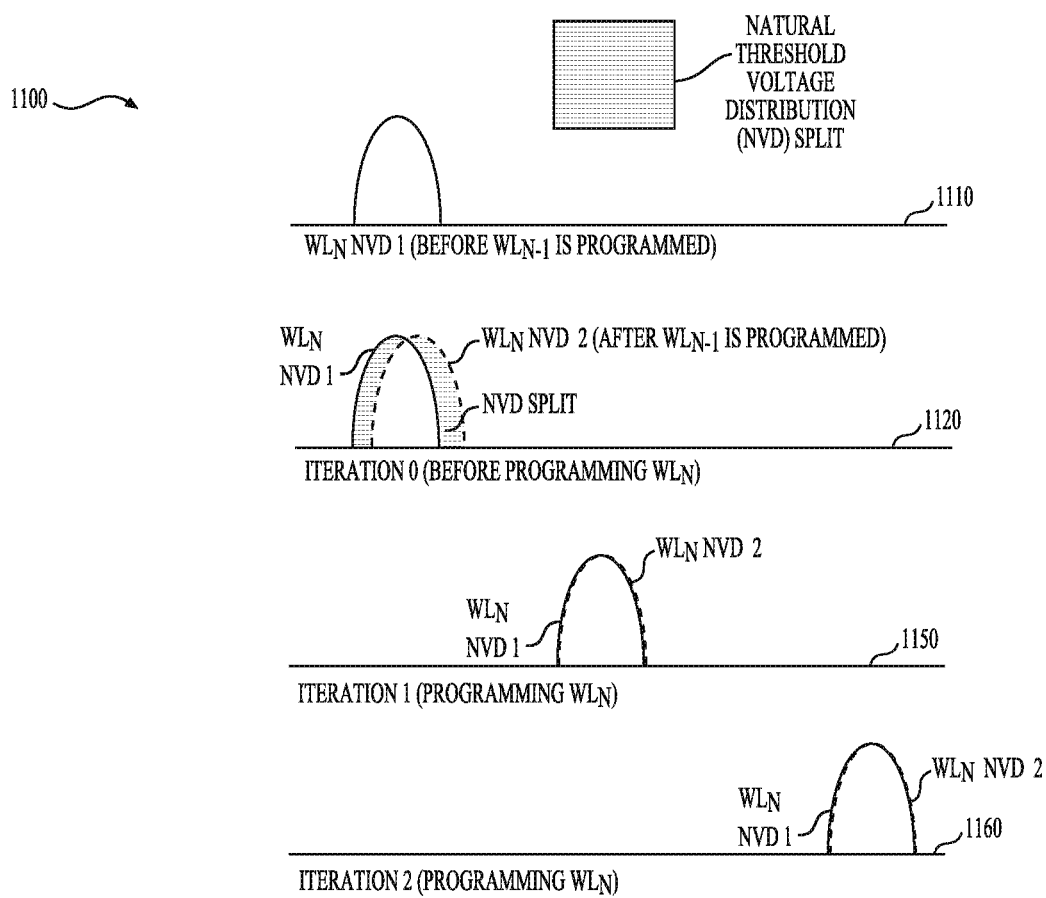
FIG. 11B illustrates a Vth distribution of the selected $WL_n$ based on the controller compensating for an NVD split caused by the interference of the neighboring $WL_{n-1}$.

FIG. 11B illustrates a Vth distribution of the selected $WL_n$ based on the controller compensating for an NVD split caused by the interference of the neighboring $WL_{n-1}$. As described above in connection with reference numbers 1110 and 1120, an NVD split occurs based on the interference caused by programming the neighboring $WL_{n-1}$. The NVD split is between a first $WL_n$ NVD and a second $WL_n$ NVD.

In some embodiments, the controller may, before performing the program operation, determine bit line voltage biases to apply to bit lines connecting to the selected $WL_n$ during the programming operation, as described in connection with FIGS. 10A and 10B. Application of the bit line voltage biases compensates for interference caused from programming the neighboring $WL_{n-1}$, and as shown, eliminates (or greatly reduces) the NVD split.

In some embodiments, a bit line voltage bias may correspond to a voltage difference equal to the NVD split. For example, the NVD split may be 200 mV between a first Vth distribution before neighboring $WL_{n-1}$ is programmed and a second Vth distribution after neighboring $WL_{n-1}$ is programmed. In this case, before the selected $WL_n$ is programmed, the controller may determine that a bit line voltage bias of 200 mV is to be applied to memory cells with neighboring memory cells in a programmed data state and that a bit line voltage bias of 0 mV is to be applied to memory cells with neighboring memory cells in an erased data state. This will slow down the faster-moving neighboring memory cells. Furthermore, the controller may increase a default program voltage by 200 mV. This will allow any memory cells adjacent to neighboring memory cells with an erased data state to have matching Vth distributions with the memory cells that are adjacent to neighboring memory cells with a programmed data state, thereby eliminating NVD split.

As shown by reference number 1150, the controller may perform the first iteration of the program operation to cause each $WL_n$ NVD to shift to the right. As shown by reference number 1150, the controller may perform the first iteration of the program operation to cause each $WL_n$ NVD to shift further to the right. As shown, use of the determined bit line voltage biases to compensate for interference eliminates the NVD split.

By eliminating or reducing NVD split, the controller may be configured to selectively skip certain verify operations, thereby improving program loop count, conserving resources (e.g., power resources, processing resources, memory resources, and/or the like) that would have otherwise be expended performing one or more additional iterations of the program-verify operation, and/or the like.

Figure 12:
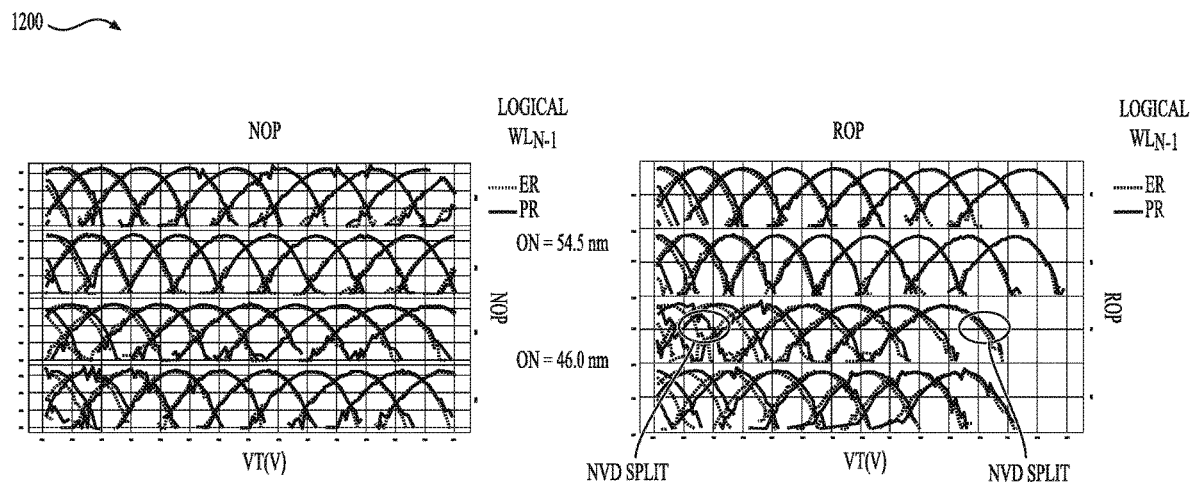
FIG. 12 illustrates example graphical representations 1200 of a natural threshold voltage (Vth) distribution (NVD) split implemented in two different programming schemes.

FIG. 12 illustrates example graphical representations 1200 of a natural threshold voltage (Vth) distribution (NVD) split implemented in two different programming schemes. For example, a first graphical representation on the left hand side of FIG. 12 illustrates an NVD split for a normal ordering programming (NOP) scheme. The solid black lines represent a Vth distribution for memory cells that have neighboring memory cells with a programmed (PR) data state. The dotted lines represent a Vth distribution for memory cells that have neighboring memory cells with an erased data state. The four rows represent four separate iterations of a program operation. A second graphical representation on the right hand side of FIG. 12 illustrates an NVD split for a reverse order programming (ROP) scheme. Spaces between solid lines and dotted lines have been circled to provide specific examples of the NVD split.

By eliminating the NVD split (as described elsewhere herein), the solid lines and dotted lines will converge, thereby allowing more efficient verify operations to be performed.

Figure 13:
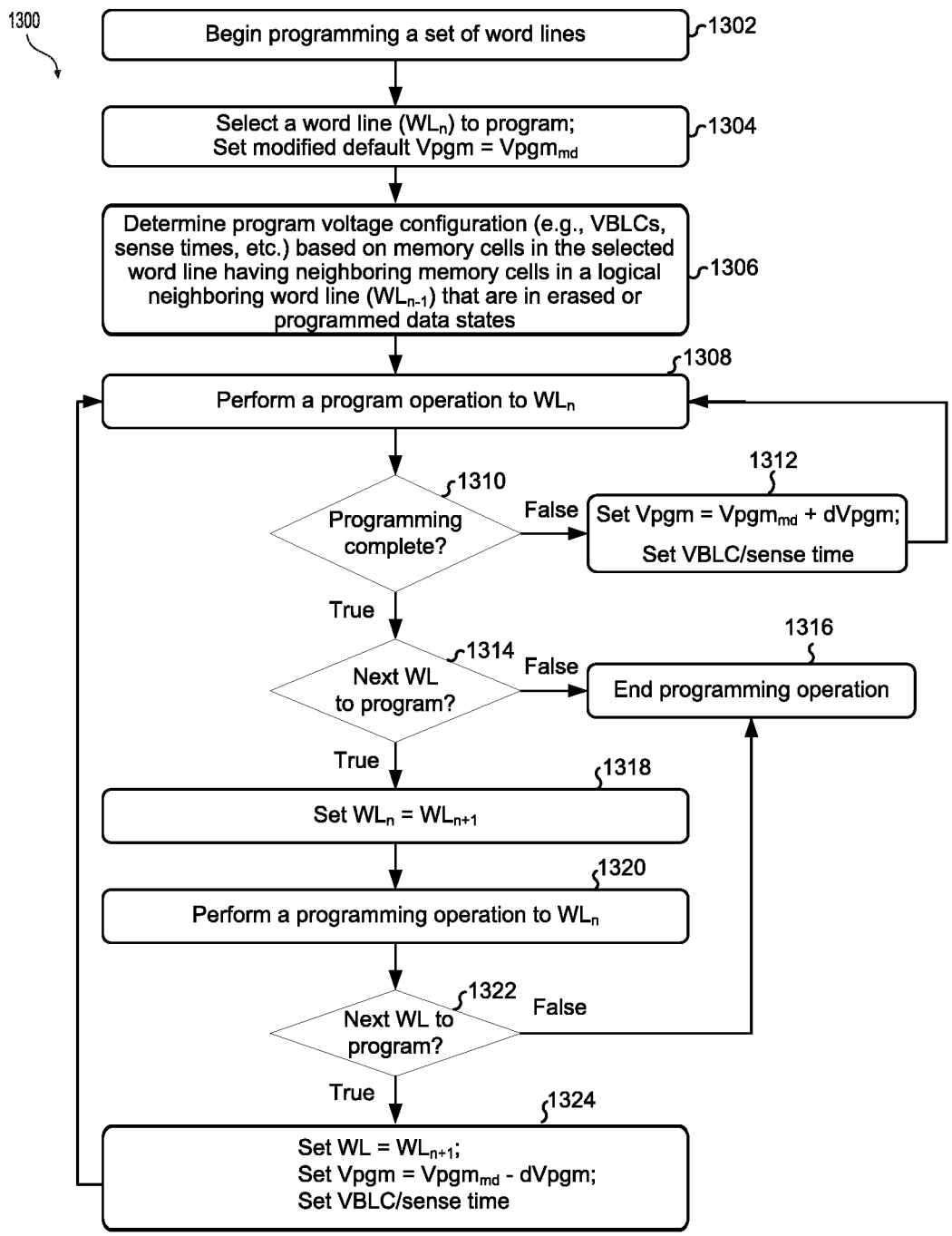
FIG. 13 is a flowchart of an example method 1300 for performing a program operation on memory cells of a selected word line in a manner that compensates for NWI caused while programming the neighboring $WL_{n-1}$.

FIG. 13 is a flowchart of a method 1300 for performing a program operation on memory cells of a selected word line. In some embodiments, the method 1300 may be implemented by a controller, control circuitry, a processor, and/or the like, as described elsewhere herein. In some embodiments, the program operation may be part of a program-verify operation that includes a verify operation to verify when programming of respective memory cells has been completed. In some embodiments, the verify operation may be a multistep verify (MSV) operation.

Step 1302 begins a programming operation for a set of word lines or for at least one word line. Step 1304 selects a word line to program (e.g., word line [$WL_n$]) and sets a word line voltage (Vpgm) to a modified default program voltage ($Vpgm_{md}$). In some embodiments, the word line voltage (Vpgm) may be predetermined or preconfigured to a set values, such as 14 V. In some embodiments, a modified default program voltage ($Vpgm_{md}$) may be determined by adding a default program voltage and an interference compensation voltage. The interference compensation voltage may be determined based on a natural threshold voltage distribution (NVD) split between an NVD of the selected word line at a first time (e.g., before a logical neighboring word line ($WL_{n-1}$) is programmed) and an NVD of the selected word line at a second time (e.g., after the logical neighboring word line ($WL_{n-1}$) is programmed).

Step 1306 determines a program voltage configuration based on memory cells in the selected word line having neighboring memory cells in a logical neighboring word line ($WL_{n-1}$) that are in erased or programmed data states. In some embodiments, step 1306 may determine bit line voltage biases that may be applied to one or more bit lines connecting to the memory cells of the selected word line. In some embodiments, step 1306 may determine sense times that may be used to charge sense nodes of the memory cells of the selected word line. Each respective program voltage configuration may be used as part of the program operation to eliminate an NVD split caused by the logical neighboring word line ($WL_{n-1}$).

Step 1308 performs a program iteration which includes using the program voltage configuration to bias bit lines connecting to the selected word line and applying the Vpgm (set to the modified default $Vpgm_{md}$) to one or more of the memory cells coupled to $WL_n$ in a programming operation. In some embodiments, step 1308 includes causing bit line voltage biases to be provided to the bit lines connecting to the selected word line and applying the Vpgm to one or more of the memory cells. Memory cells of the selected word line may have neighboring memory cells in erased or programmed data states. The bit line voltage biases may, for example, have larger biases if the memory cells have neighboring memory cells in programmed data states (e.g., relative to lower biases for memory cells that have neighboring memory cells in erased data states).

Decision step 1310 determines if programming of the word line is complete, e.g., based on the results of a verify operation. The programming may be complete, for example, if all or nearly all of the cells of the word line have been programmed to their assigned data state, i.e., the data state they were assigned to represent. If decision step 1310 is false, then at step 1312, Vpgm is incrementally increased by the identified dVpgm, i.e., Vpgm is set to Vpgm+dVpgm. In one example, dVpgm is one half of a Volt (0.5 V). Additionally, the bit line voltage biases or sense times may be set (reset) in order to match a real-time or near real-time NVD split of the selected word line. In one example, the bit line voltage biases or sense times may be incrementally decreased during successive iterations of the program operation. Next, the programming operation returns to step 1308 to conduct the next program iteration. Each repetition of step 1308 until decision step 1310 is true is one program loop, which requires resources from the controller.

If decision step 1310 is true (the program operation to $WL_n$ was successful), a decision step 1314 determines if there is a next word line to program. If decision step 1314 is false (there are no additional word lines to program), then the programming operation ends at step 1316. If decision step 1314 is true, then at step 1318, $WL_n$ is incrementally advanced to the next word line to be programmed, i.e., $WL_n$ is set to $WL_{n+1}$.

Step 1320 performs a programming operation which includes applying Vpgm to $WL_n$. The Vpgm which is applied at step 1320 is the Vpgm which ultimately was successful at step 1308, and thus, Vpgm at step 1320 may be equal to or greater than Vpgmu.

Decision step 1322 determines if there is a next word line to program. If decision step 1322 is false (there are no additional word lines to program), then the programming operation ends at step 1316. If decision step 1322 is true, then at step 1324, $WL_n$ is incrementally advanced to the next word line to be programmed ($WL_n$ is set to $WL_{n+1}$), Vpgm is incrementally decreased (stepped down) by dVpgm (Vpgm is set to Vpgm-dVpgm), and the bit line voltage biases or sense times may be incrementally increased to an appropriate value needed to start a new iteration of the program operation. The method then returns to the program operation at step 1308.

In the above example, the cumulative number of program loops (and corresponding verify loops) which must be completed to successfully program the set of word lines is reduced relative to other known programming operations which are unable to identify word line voltage based on memory cells respective word lines having positions that correspond to particular NAND string groups. In other words, the programming operation optimizes the time to acquire the optimal programming voltages. Thus, the overall performance and the endurance of the memory device are both improved.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

Various terms are used to refer to particular system components. Different companies may refer to a component by different names—this document does not intend to distinguish between components that differ in name but not function. In the claims, and elsewhere herein, the terms "including" and "comprising" are used in an open-ended fashion, and thus should be interpreted to mean "including, but not limited to . . . ." Additionally, the singular forms "a," "an," and "the" may be intended to include the plural forms as well, unless the context clearly indicates otherwise. Also, the term "couple" or "couples" is intended to mean either an indirect or direct connection. Thus, if a first device couples to a second device, that connection may be through a direct connection or through an indirect connection via other devices and connections.

As used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Additionally, when a layer or element is referred to as being "on" another layer or substrate, in may be directly on the other layer of substrate, or intervening layers may also be present. Further, it will be understood that when a layer is referred to as being "under" another layer, it may be directly under, and one or more intervening layers may also be present. Furthermore, when a layer is referred to as "between" two layers, it may be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptions used herein interpreted accordingly.

The method steps, processes, and operations described herein are not to be construed as necessarily requiring their performance in the particular order discussed or illustrated, unless specifically identified as an order of performance. It is also to be understood that additional or alternative steps may be employed.

What is claimed is:

1. A method of programming an array of memory cells formed using a set of word lines and a set of bit lines, the method comprising:
   determining data states for a first set of memory cells, of the array of memory cells, that are part of a logical N−1 neighboring word line that is adjacent to a selected word line;
   determining bit line voltage biases based on the data states; and
   performing, using the bit line voltage biases, a program operation on the selected word line to iteratively program respective memory cells, of a second set of memory cells that are part of the selected word line, wherein performing the program operation comprises:
      causing a first bit line voltage bias to be applied to a first subset of the first set of memory cells based on the first subset having neighboring memory cells in an erased data state, and
      causing a second bit line voltage bias, that is higher than the first bit line voltage bias, to be applied to a second subset of the first set of memory cells based on the second subset having neighboring memory cells in a programmed data state, the first bit line voltage bias and the second bit line voltage bias to eliminate or reduce a natural threshold voltage distribution (NVD) split of the selected word line, wherein determining the data states, determining the program voltage configuration, and performing the program operation are to be repeated until a program stop condition is satisfied.

2. The method as set forth in claim 1, wherein performing the program operation comprises:
   causing a modified program voltage to be applied to the selected word line during a first iteration of the program operation, the modified program voltage having a value based on a natural threshold voltage distribution (NVD) split associated with the selected word line.

3. The method as set forth in claim 1, further comprising:
   performing a verify operation that includes verifying data states of the respective memory cells, of the second set of memory cells, during select iterations of the verify operation, wherein a frequency at which to verify the data states is based on a natural threshold voltage distribution (NVD) for the selected word line.

4. The method as set forth in claim 1, wherein the first set of memory cells are programmed using a normal order programming (NOP) scheme and the logical N−1 neighboring word line is a physical N−1 neighboring word line.

5. The method as set forth in claim 1, wherein the first set of memory cells are programmed using a reverse order programming (ROP) scheme and the logical N−1 neighboring word line is a physical N+1 neighboring word line.

6. The method as set forth in claim 1, wherein the array of memory cells are part of a group of at least 20 NAND memory strings included in bit cost scalable (BiCS) architecture.

* * * * *